(12) United States Patent
Xie et al.

(10) Patent No.: US 12,457,780 B2
(45) Date of Patent: Oct. 28, 2025

(54) SEMICONDUCTOR DEVICE WITH VOID UNDER SOURCE/DRAIN REGION FOR BACKSIDE CONTACT

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Daniel Schmidt, Niskayuna, NY (US); Tsung-Sheng Kang, Ballston Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 439 days.

(21) Appl. No.: 18/073,024

(22) Filed: Dec. 1, 2022

(65) Prior Publication Data
US 2024/0186374 A1 Jun. 6, 2024

(51) Int. Cl.
| | |
|---|---|
| *H10D 62/10* | (2025.01) |
| *H01L 21/74* | (2006.01) |
| *H01L 21/768* | (2006.01) |
| *H01L 23/48* | (2006.01) |
| *H01L 23/528* | (2006.01) |
| *H10D 30/01* | (2025.01) |
| *H10D 30/43* | (2025.01) |
| *H10D 30/67* | (2025.01) |
| *H10D 62/13* | (2025.01) |
| *H10D 64/01* | (2025.01) |
| *H10D 64/23* | (2025.01) |

(Continued)

(52) U.S. Cl.
CPC ........ *H10D 62/121* (2025.01); *H01L 23/481* (2013.01); *H10D 30/014* (2025.01); *H10D 30/43* (2025.01); *H10D 30/6757* (2025.01); *H10D 62/151* (2025.01); *H10D 64/017* (2025.01); *H10D 84/0128* (2025.01); *H10D 84/013* (2025.01); *H10D 84/0149* (2025.01); *H10D 84/038* (2025.01)

(58) Field of Classification Search
CPC ............... H01L 23/481; H01L 21/743; H01L 21/76897; H01L 23/5286; H01L 21/76898; H10D 84/013; H10D 84/0149; H10D 30/0198; H10D 64/254; H10D 84/0186; H10D 62/121; H10D 30/014; H10D 30/43; H10D 30/6757; H10D 84/0128; H10D 30/6735
See application file for complete search history.

(56) References Cited

U.S. PATENT DOCUMENTS

| | | |
|---|---|---|
| 9,059,257 B2 | 6/2015 | Li et al. |
| 9,466,723 B1 | 10/2016 | Huang et al. |
| 10,741,441 B2 | 8/2020 | Li et al. |

(Continued)

*Primary Examiner* — Sonya McCall-Shepard
(74) *Attorney, Agent, or Firm* — Kimberly Zillig

(57) ABSTRACT

Embodiments are disclosed for a method for fabricating a semiconductor device. The method includes forming a recess under a region for a source/drain (S/D). The method further includes depositing a sacrificial placeholder liner conformally. Additionally, the method includes performing a sacrificial material overfill. Further, the method includes performing an etch back of the sacrificial material overfill. Also, the method includes performing S/D epitaxial (epi) growth over a remaining placeholder sacrificial liner to generate an S/D epi for the S/D.

6 Claims, 21 Drawing Sheets

(51) Int. Cl.
*H10D 84/01* (2025.01)
*H10D 84/03* (2025.01)

(56) References Cited

U.S. PATENT DOCUMENTS

| | | | |
|---|---|---|---|
| 10,886,217 B2 | 1/2021 | Morrow et al. | |
| 11,404,548 B2 * | 8/2022 | Yu | H10D 30/6757 |
| 2021/0111115 A1 | 4/2021 | Morrow et al. | |
| 2021/0134721 A1 | 5/2021 | Chiang et al. | |
| 2021/0202385 A1 | 7/2021 | Huang et al. | |
| 2021/0305252 A1 | 9/2021 | Chiang et al. | |
| 2021/0305381 A1 | 9/2021 | Chiang et al. | |
| 2021/0336019 A1 | 10/2021 | Su et al. | |
| 2021/0351303 A1 | 11/2021 | Ju et al. | |
| 2021/0376071 A1 | 12/2021 | Liu et al. | |
| 2021/0376093 A1 | 12/2021 | Chu et al. | |
| 2021/0391421 A1 | 12/2021 | Chu et al. | |
| 2021/0399099 A1 | 12/2021 | Chu et al. | |
| 2022/0181197 A1 | 6/2022 | Tao | |

* cited by examiner

SEMICONDUCTOR DEVICE WITH VOID UNDER SOURCE/DRAIN REGION FOR BACKSIDE CONTACT

BACKGROUND

The present disclosure relates to backside contact formation, and more specifically, to a semiconductor device with void under the source/drain region for backside contact formation.

Semiconductor devices can include computer processors, computer memories, and the like. These devices can include field effect transistors, such as a fin field effect transistor (FINFET).

SUMMARY

Embodiments are disclosed for a method for fabricating a semiconductor device. The method includes forming a recess under a region for a source/drain (S/D). The method further includes depositing a sacrificial placeholder liner conformally. Additionally, the method includes performing a sacrificial material overfill. Further, the method includes performing an etch back of the sacrificial material overfill. Also, the method includes performing S/D epitaxial (epi) growth over a remaining placeholder sacrificial liner to generate an S/D epi for the S/D.

Embodiments are disclosed for a semiconductor device. The semiconductor device includes a field effect transistor (FET). Additionally, the semiconductor device includes a frontside contact that wires a first source/drain (S/D) epitaxial (epi) of the FET to a back end of line (BEOL) interconnect. Further, the semiconductor device includes a placeholder recess disposed under the first S/D epi. Also, the semiconductor device includes a sacrificial placeholder that lines the placeholder recess. Additionally, the semiconductor device includes a void between the sacrificial placeholder and the first S/D epi.

Further aspects of the present disclosure are directed toward computer program products with functionality similar to the functionality discussed above regarding the computer-implemented methods. The present summary is not intended to illustrate each aspect of every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
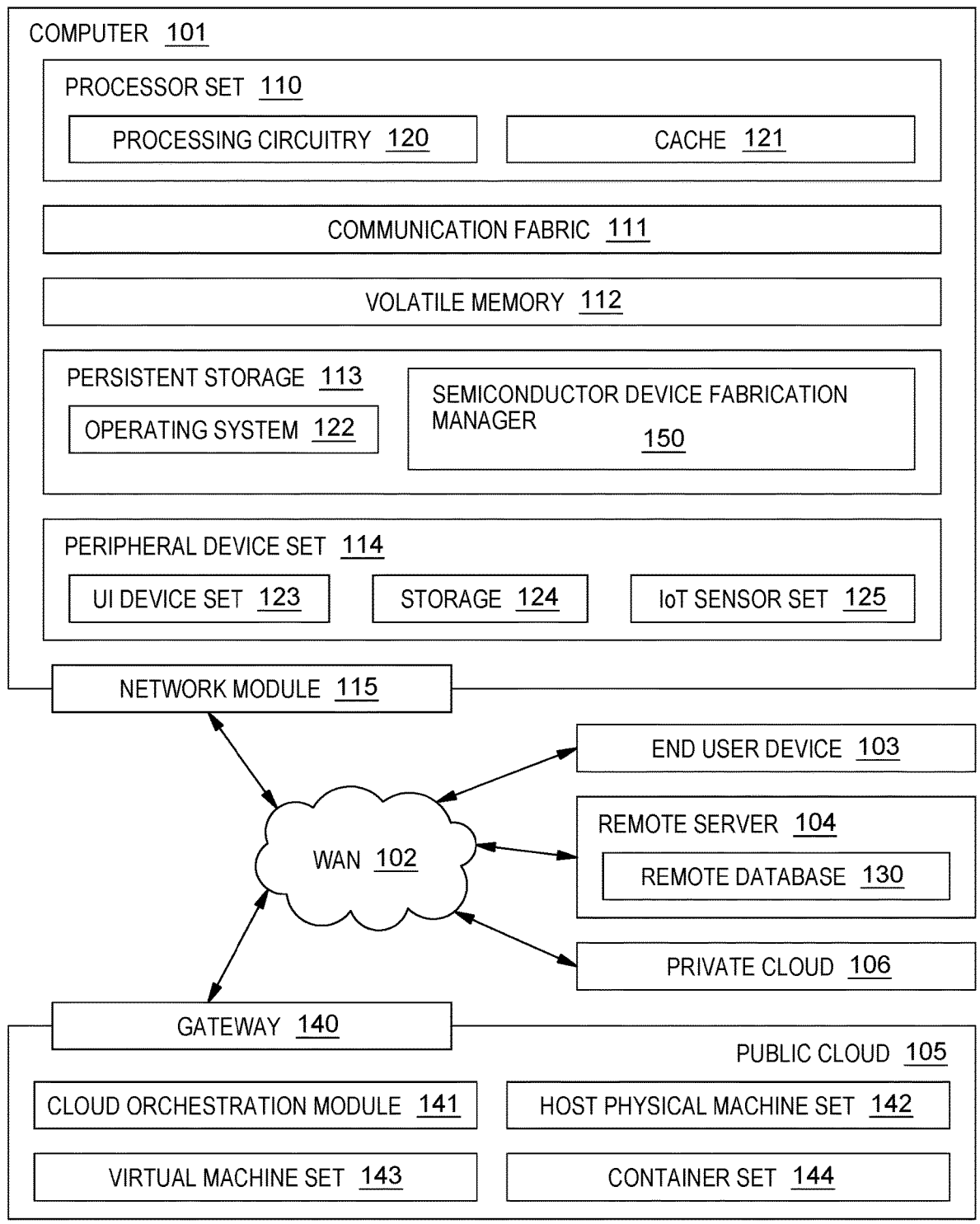
FIG. 1 is a block diagram of an example computing environment, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the embodiments described. On the contrary, the intention is to cover all modifications, equivalents, and alternatives falling within the spirit and scope of the present disclosure.

DETAILED DESCRIPTION

In the fabrication of semiconductor devices, it can be useful to describe their fabrication with respect to specific perspectives, or views. For example, semiconductor devices can be described with respect to having a backside and a frontside. The backside and the frontside can represent a perspective with respect to specific elements of the device, i.e., the back end of line (BEOL) interconnect and the backside interconnect. More specifically, the term, frontside, refers to the BEOL interconnect. Conversely, the term, backside, refers to the backside interconnect, which includes a backside power distribution network.

Further, these devices include wiring (i.e., contacts) that connect the power and signal routing to the S/D epis and gates of the device. However, current systems can combine power and signal routing in the BEOL, which can cause metal congestion (e.g., a relatively large amount of wiring in a limited space). One possible approach for reducing metal congestion may be to use backside contacts to the backside interconnects that power the devices. Such an approach may reduce the amount of wiring in the BEOL, and increase the available space in the BEOL for signal routings.

However, such an approach involves forming backside contacts over S/D epis using a lithography patterning process from the backside of the wafer. This may be challenging because backside overlay control can be less accurate in its patterning than frontside processing. As such, misalignment of backside contacts may cause the contacts to connect to gate shorts, which can make the device inoperable. However, one way to mitigate this issue is to form sacrificial placeholders under the S/D region. Within this context, the term "under" means the sacrificial placeholders are disposed between the S/D epi and the backside interconnect. In this way, backside contact alignment can be relaxed. With the sacrificial placeholders, it may be possible to form backside contacts that do not connect to gate shorts. However, after fabrication, the placeholder materials may remain in the S/D regions that do not have backside contacts, which may have detrimental effects on the operation of the device. For example, the remaining placeholder materials may generate physical stress on the device that degrades device performance.

Accordingly, some embodiments of the present disclosure can fabricate a semiconductor device with a sacrificial placeholder disposed under an S/D epi structure with airgap. The airgap is an example of a void, and can provide a region within which the S/D epi structure can grow, thus providing more contact area for backside contacts. Such embodiments can pattern a backside contact opening over the sacrificial placeholder (e.g., under the S/D epi with airgap). Accordingly, such embodiments can use the backside contact opening to fill the sacrificial placeholder region with backside contact metals, in contact with the increased contact area of the S/D epi. In this way, such embodiments can provide the semiconductor device with a sacrificial placeholder under an S/D epi structure with airgap.

According to some embodiments of the present disclosure, it may be possible to generate placeholders uniformly (e.g., withing 10 nanometers (nm)) in semiconductor devices. By generating the placeholders uniformly, it may be possible to generate semiconductor devices that have backside contacts that provide a power supply, thus creating an increased amount of the BEOL region for signal wiring. Additionally, the uniform placeholder formation can enable the creation of an opening, within which epitaxial growth can provide an increased amount of contact surface area between the backside contacts and the S/D epis of the device. Further, the remaining portions of sacrificial placeholder under S/D epi regions may not adversely affect the semiconductor device, as opposed to conventional techniques in which remaining placeholder materials may generate physical stress that degrades device performance. In these ways, such embodiments can increase the computational power, and power efficiency, of the device, without the adverse effects of current techniques.

FIG. 1 is a block diagram of an example computing environment 100, in accordance with some embodiments of the present disclosure. Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as semiconductor device fabrication manager 150. In addition, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and semiconductor device fabrication manager 150, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in semiconductor device fabrication manager 150 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 150 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
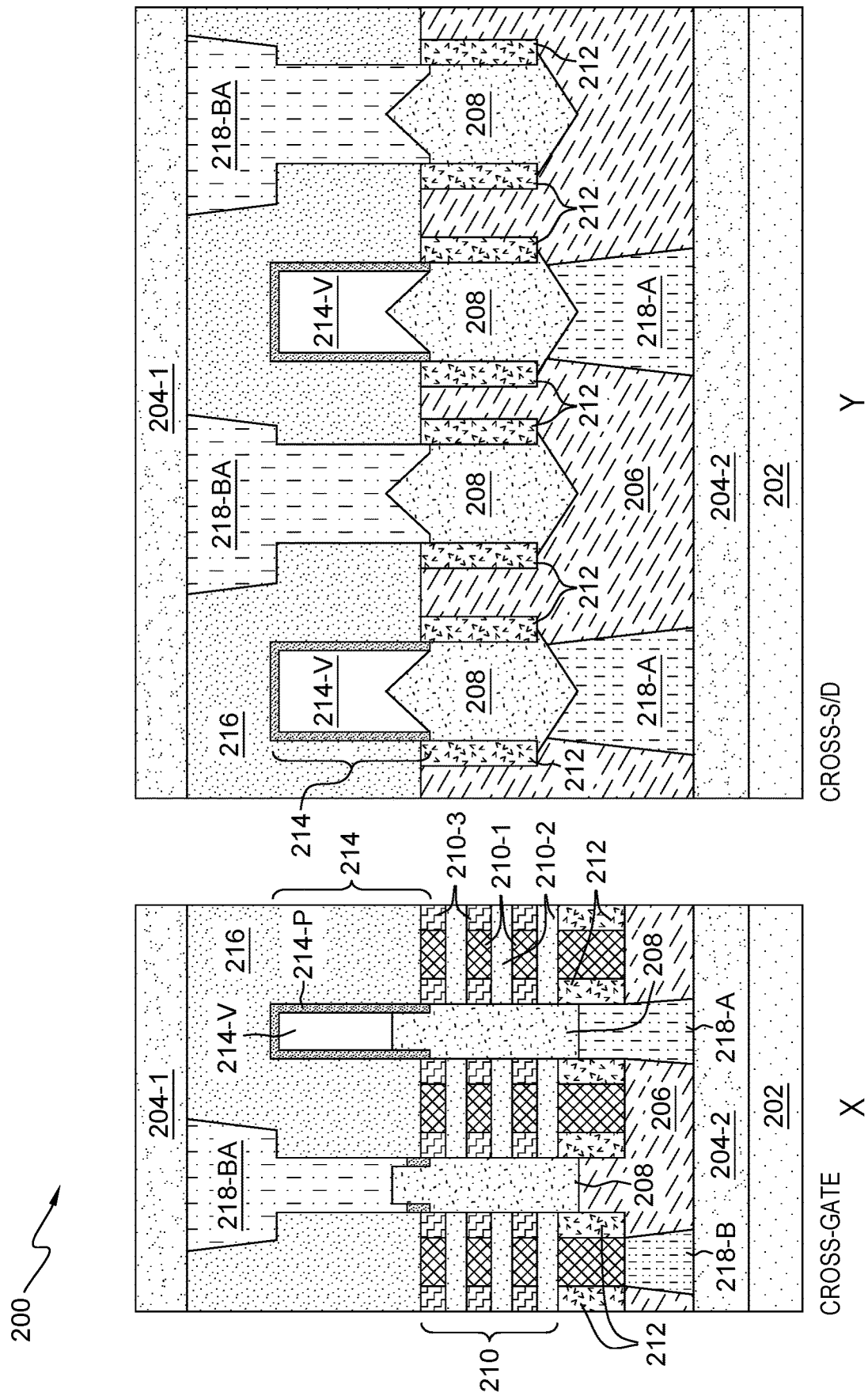
FIG. 2 is a block diagram of an example complementary metal oxide semiconductor (CMOS) device, in accordance with some embodiments of the present disclosure.

FIG. 2 is a block diagram of an example semiconductor device 200, in accordance with some embodiments of the present disclosure. The example semiconductor device 200 includes carrier wafer 202, backside interconnect 204-1, back end of line (BEOL) 204-2, interlayer dielectric (ILD) 206, source/drain epitaxies (S/D epis) 208, nanosheet stack 210, which includes: high-K metal gates (HK/MGs) 210-1, nanosheet channels 210-2, and inner spaces 210-3; spacers (Sp) 212, recess 214, placeholder liner 214-P, void 214-V, buried oxide (BOX) layer 216; backside contact (BSCA) 218-BA, contact A 218-A, and contact B 218-B, (collectively referred to herein as contacts 218). According to some embodiments of the present disclosure, the example semiconductor device 200 includes a sacrificial placeholder (e.g., placeholder liner 214-P) disposed under an S/D epi structure with airgap (e.g., S/D epi 208 with void 214-V), and the backside interconnect 204-1. In this way, the example semiconductor device 200 can provide a self-aligned backside contact. To form self-aligned backside contacts, it can be useful to form a liner with a void under the S/D epi before flipping the wafer during fabrication.

More specifically, the carrier wafer 202 can represent a layer of silicon (Si). Further, the backside interconnect 204-1 and BEOL 204-2 can be composed of multiple layers of metal lines and vias (e.g., copper (Cu) based interconnects). Additionally, the ILD 206 may be any dielectric material that would be both useful and otherwise consistent with the embodiments of the present disclosure (e.g., SiO2, SiN, SiBCN, SiOCN, SiOC, SiC, and the like). The S/D epi 208 can be heavily doped epitaxial layers, such as boron-doped SiGe for p-type field effect transistors (PFETs) or phosphorus-doped Si for n-type FETs (NFETs).

As stated previously, the nanosheet stack 210 includes the HK/MGs 210-1 and the, nanosheet channels 210-2, and inner spacers (IS) 210-3. The HK/MGs 210-1 can include a transistor gate electrode and gate dielectric of high k material (e.g., k=7 or more). The materials for the HK/MGs may differ based on the type of device under construction (e.g., N-type or P-type field effect transistor (FET)). The nanosheet channels 210-2 can include nano-sheets, which may be a semiconductor that can be conductive in a transistor, "on" state, or highly resistive in a transistor, "off" state. The conductivity of the nanosheet channels 210-2 can be controlled by the HK/MGs 210-1. The inner spacers 210-3 can represent a dielectric material that provides a spacing between the HK/MGs 210-1 and the S/D epis 208.

The spacers 212 can be similar to the inner spacers 210-3 and include layers of dielectric material deposited and etched back to provide a spacing between the HK/MGs 210-1 and the contacts 218. The contacts 218 can represent wiring that enables current flow between the backside interconnect 204-1 and the S/D epis 208. Additionally, the contacts 218-A, 218-B can enable current flow between the BEOL 204-2 and the HK/MGs 210-1, and the BEOL 204-2 and the S/D epis 208.

According to some embodiments of the present disclosure, the semiconductor device 200 includes the recess 214, which includes a placeholder liner 214-P, and a void 214-V. The recess 214 can provide a void space 214-V under the S/D epis 208. Providing this void space can prevent any unfavorable stress impact to the S/D epi 208. The placeholder liner 214-P can be an artifact from fabrication of the recess 214 that enables the creation of the void 214-V. The void 214-V may also provide an open space within which the S/D epis 208 can grow. In this way, the S/D epis 208 may represent an improvement in available surface area over S/D epis in current semiconductor devices. Such semiconductor devices may include S/D epis with one flat edge, which provides less surface (e.g., contact) area than the S/D epis 208 of the semiconductor device 200.

The BOX layer 216 can be a buried oxide material, such as SiO2, and may insulate the backside contacts (BSCA) 218-BA from each other. The BSCA 218-BA can represent wiring that enables current flow between the backside interconnect 204-1 and the S/D epis 208. The BSCA 218-BA can provide a power supply, and the frontside contacts (i.e., contact A 218-A and contact B 218-B) can provide signal routing.

Figure 3A:
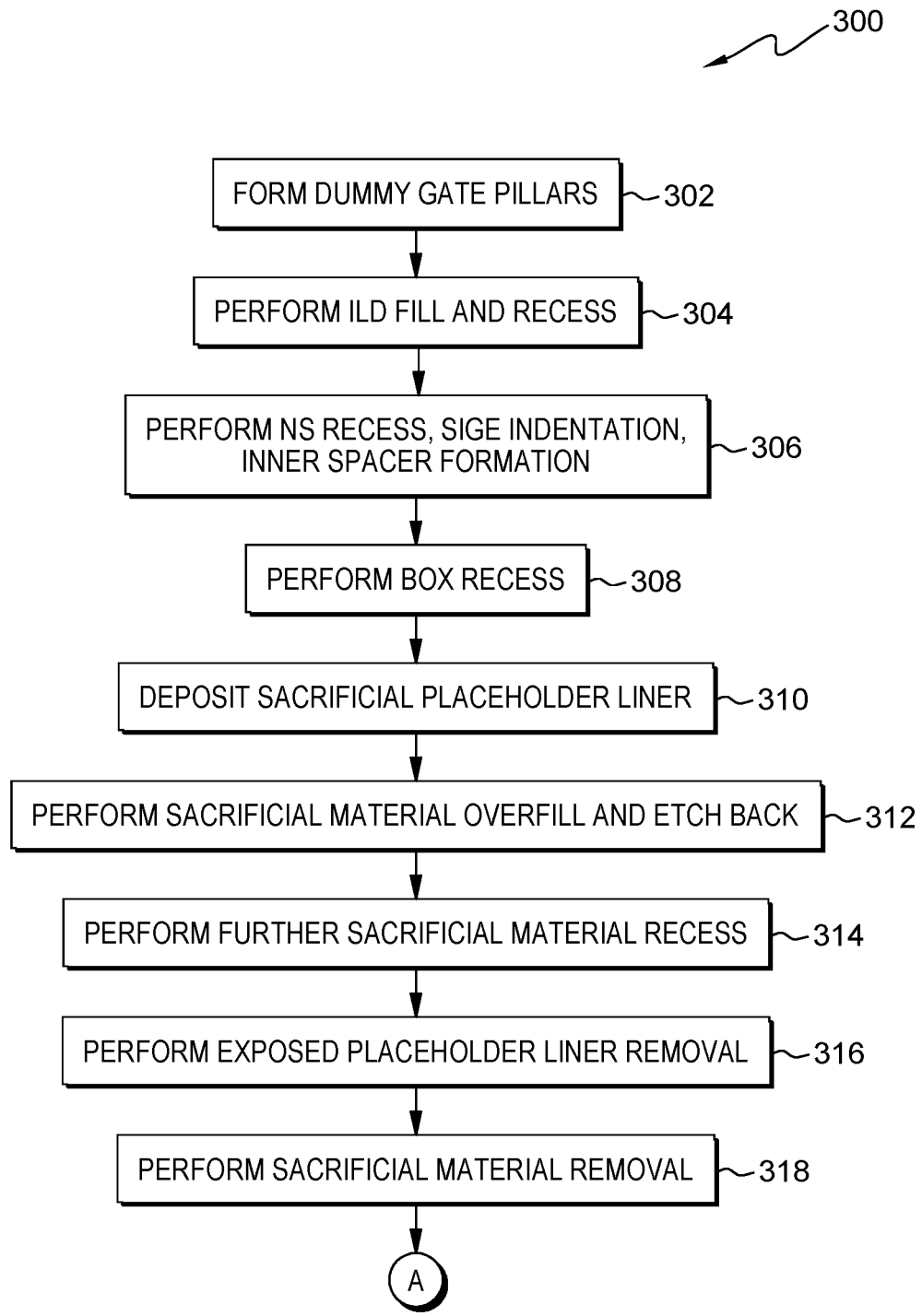
FIGS. 3A and 3B are a process flow chart of a method for fabricating an example semiconductor device, in accordance with some embodiments of the present disclosure.
Figure 3B:
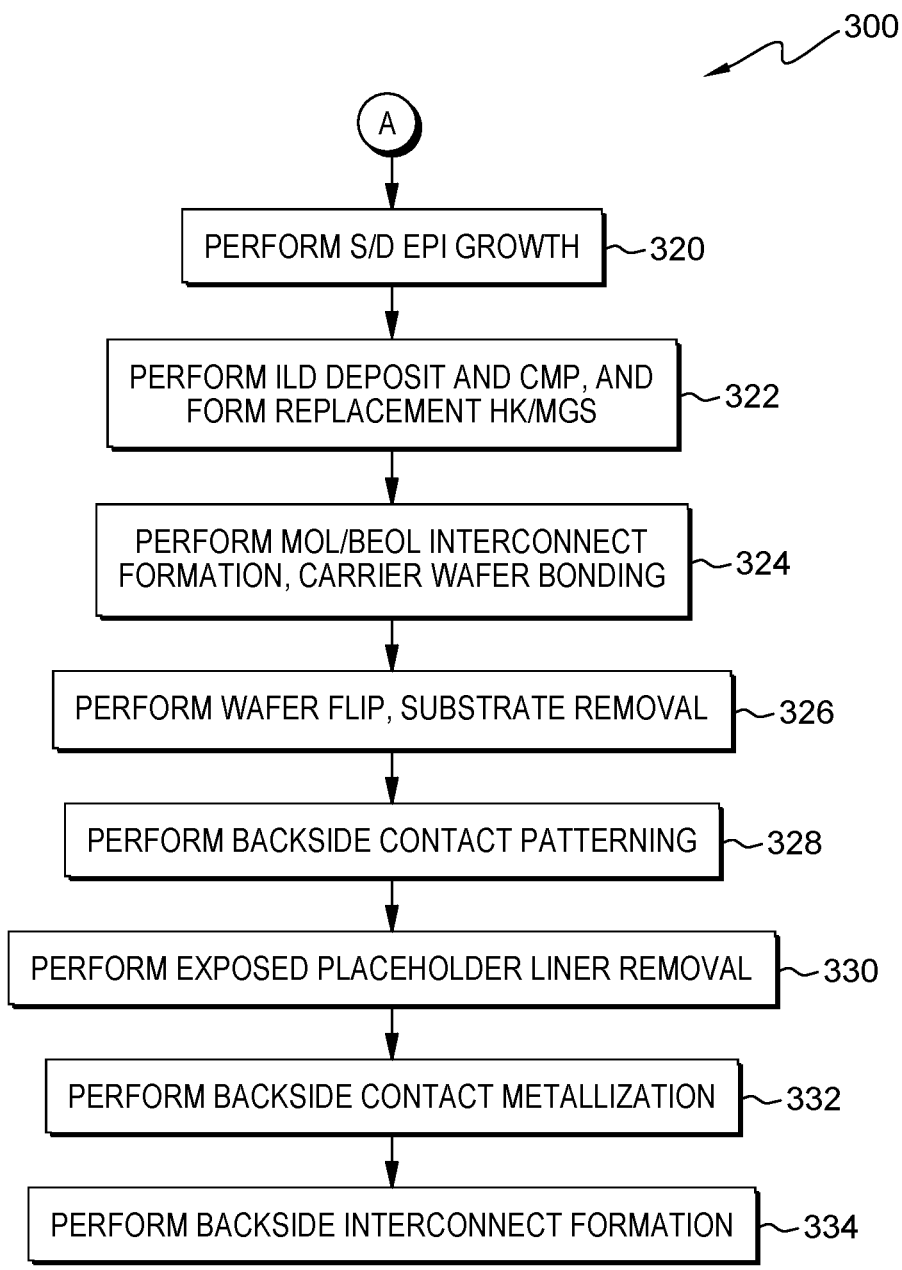
Figure 4A:
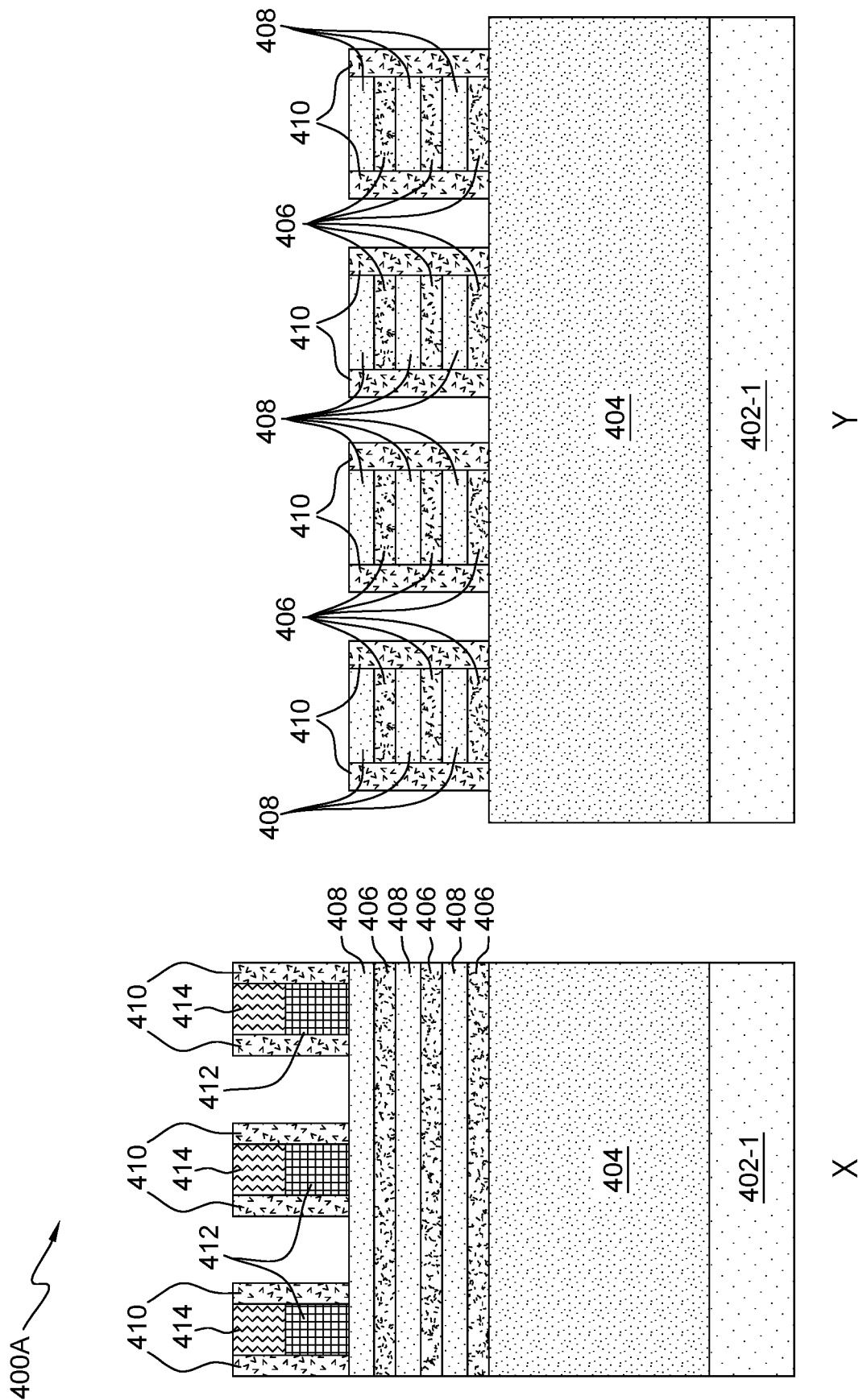
FIGS. 4A, 4B, 4C, 4D, 4E, 4F, 4G, 4H, 4I, 4J, 4K, 4L, 4M, 4N, 4O, 4P, and 4Q, are example fabrication states of an example semiconductor device, in accordance with some embodiments of the present disclosure.

FIG. 3 (encompassing FIGS. 3A and 3B) is a process flow chart of a method 300 for fabricating a semiconductor device, in accordance with some embodiments of the present disclosure. In some embodiments, an example semiconductor device fabrication manager, such as the semiconductor device fabrication manager 150 described with respect to FIG. 1, can perform the method 300. In this method, the semiconductor device fabrication manager 150 can fabricate a semiconductor device, such as the semiconductor device 200, described with respect to FIG. 2. For clarity, the method 300 is described with respect to FIGS. 4A through 4Q. It is noted that the example fabrication represented in FIGS. 4A-4Q are merely examples of fabrication states that method 300 may produce. However, some practices of the method 300 may produce other fabrication states.

FIGS. 4A, 4B, 4C, 4D, 4E, 4F, 4G, 4H, 4I, 4J, 4K, 4L, 4M, 4N, 4O, 4P, and 4Q are example fabrication states of an example semiconductor device, in accordance with some embodiments of the present disclosure. The example semiconductor device can include, for example, the example semiconductor device 200, described with respect to FIG. 2. Referring back to FIGS. 4A through 4Q, the example fabrication states 400A-400Q include views X and Y. The X view can represent a cross-gate view of the corresponding fabrication state. In contrast, the Y view can represent a cross S/D epi view of the fabrication state. In this way, the example fabrication states 400A through 400Q can represent the example semiconductor device (being fabricated) after each operation of the method 300, as described in greater detail below.

Referring back to FIG. 3A, at operation 302, semiconductor device fabrication manager 150 can direct a fabrication tool to form dummy gates pillars. A dummy gate pillar can comprise a thin layer of SiO2 (not shown), sacrificial materials such as poly-Si 412, and gate hardmask 414. The dummy gate can serve as a placeholder for the actual gate, fabricated at a different fabrication state. Accordingly, after dummy gates are formed over nanosheet stacks, spacer deposition and spacer RIE processes are performed to form spacer 410. For clarity, operation 302 is described with respect to FIG. 4A.

FIG. 4A is an example fabrication state 400A of a semiconductor device being fabricated, according to some embodiments of the present disclosure. The example fabrication state 400A may represent the state of the semiconductor device after operation 302. The example fabrication state 400A includes views X and Y. The X view can represent a cross-gate view of the semiconductor device. In contrast, the Y view can represent a cross S/D view.

The views X and Y include a substrate 402-1, BOX layer 404, sacrificial nanosheet layers 406, channel layers 408, and spacers 410. Additionally, the view X includes dummy gate 412 and gate hardmask 414. More specifically, the substrate 402-1 can represent a substrate of the semiconductor device 200. This substrate can be composed of Si. Further, the BOX layer 404 can represent, for example, the backside ILD layer 216, described with respect to FIG. 2. Accordingly, the dielectric layer can be a buried oxide (BOX) if the starting wafer is an SOI wafer. In this way, the example fabrication state 400A can represent a state of the semiconductor device being fabricated after performing operation 302.

Nanosheet patterning can involve forming a patterned nanosheet stack over the BOX layer 404. More specifically, the fabrication tool may deposit alternate nanosheet layers of sacrificial nanosheet layers 406 with channel layers 408. The sacrificial nanosheet layers 406 may be composed of silicon germanium (e.g., SiGe). Additionally, the channel layers 408 may be composed of Si. Further, forming the dummy gate 412 can involve depositing material forming dummy gate 412 and gate hardmask 414 over the patterned nanosheet stack, and performing dummy gate patterning. Dummy gate patterning can involve forming the dummy gate 412 and forming the gate hardmask 414 over (e.g., as shown) the dummy gate 412.

Additionally, forming spacers 410 can involve depositing a dielectric material at the sidewalls of the dummy gate 412 and gate hardmask 414. The deposited material forming the spacers 410 may be any suitable dielectric material (e.g., SiN, SiBCN, SiOCN, SiOC, and the like). More specifically, the fabrication tool may form the spacers 410 by a conformal dielectric deposition and anisotropic reactive-ion etching (RIE) to remove the spacer material from horizontal surfaces.

At operation 304, the semiconductor device fabrication manager 150 can direct a fabrication tool to perform ILD fill and recess. Performing ILD fill and recess can involve depositing dielectric material between the nanosheet stacks to form the ILD 416. The ILD 416 may be any dielectric material that would be both useful and otherwise consistent with the embodiments of the present disclosure (e.g., SiO2, SiN, SiBCN, SiOCN, SiOC, and the like). Further, performing recess can involve etching back deposited ILD material from the spacers 410 and gate hardmask 414. For clarity, operation 304 is described with respect to FIG. 4B.

Figure 4B:
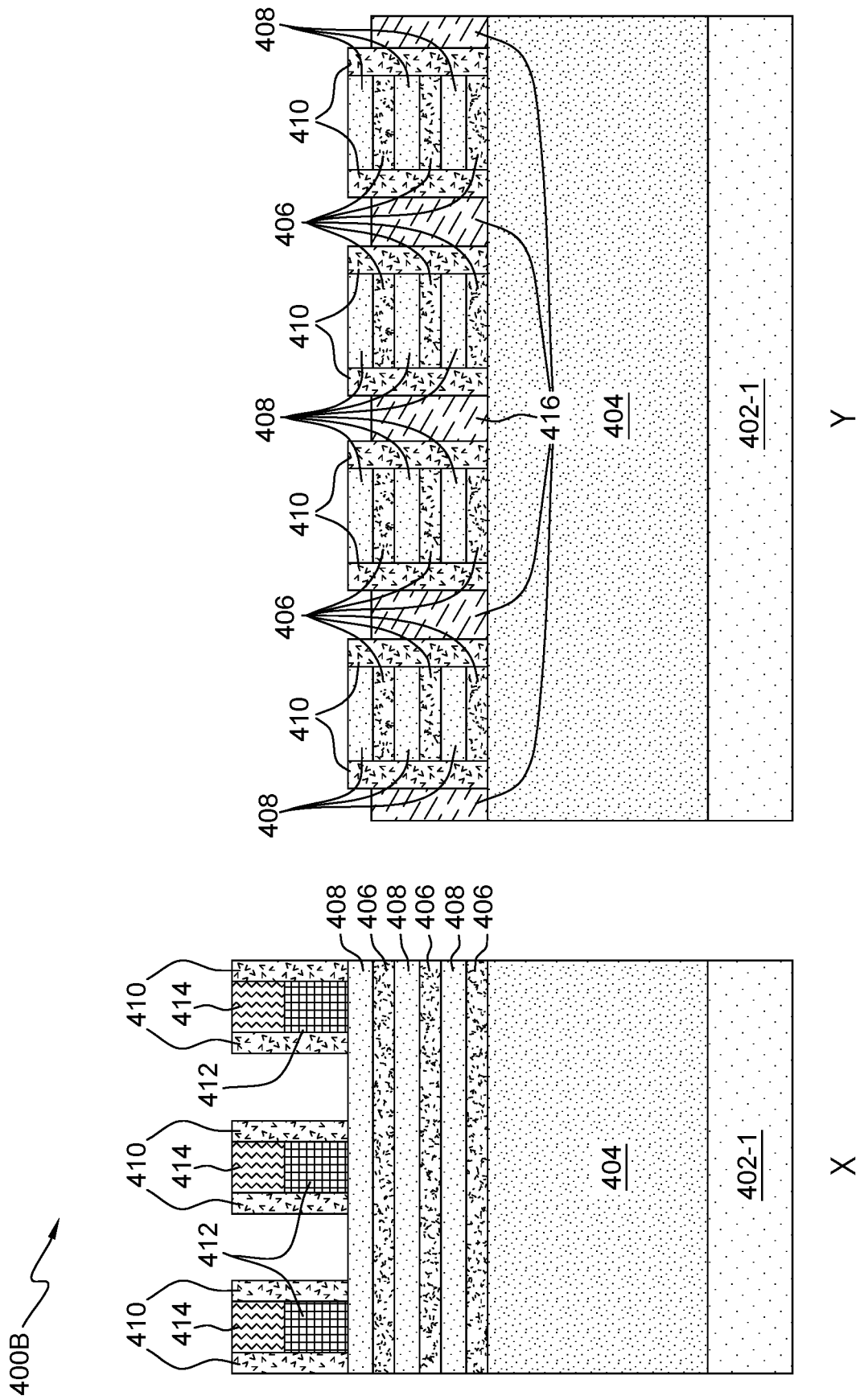

FIG. 4B is an example fabrication state 400B of a semiconductor device being fabricated, according to some embodiments of the present disclosure. In comparison to example fabrication state 400A, the view X of example fabrication state 400B is unchanged. However, the view Y additionally includes the ILD 416. In this way, the example fabrication state 400A can represent a state of the semiconductor device being fabricated after performing operation 304.

At operation 306, the semiconductor device fabrication manager 150 can direct a fabrication tool to form inner spacers. Forming inner spacers (e.g., inner spacers 418) can involve performing a nanosheet recess, SiGe indentation, and inner spacer formation. For clarity, operation 306 is described with respect to FIG. 4C.

Figure 4C:
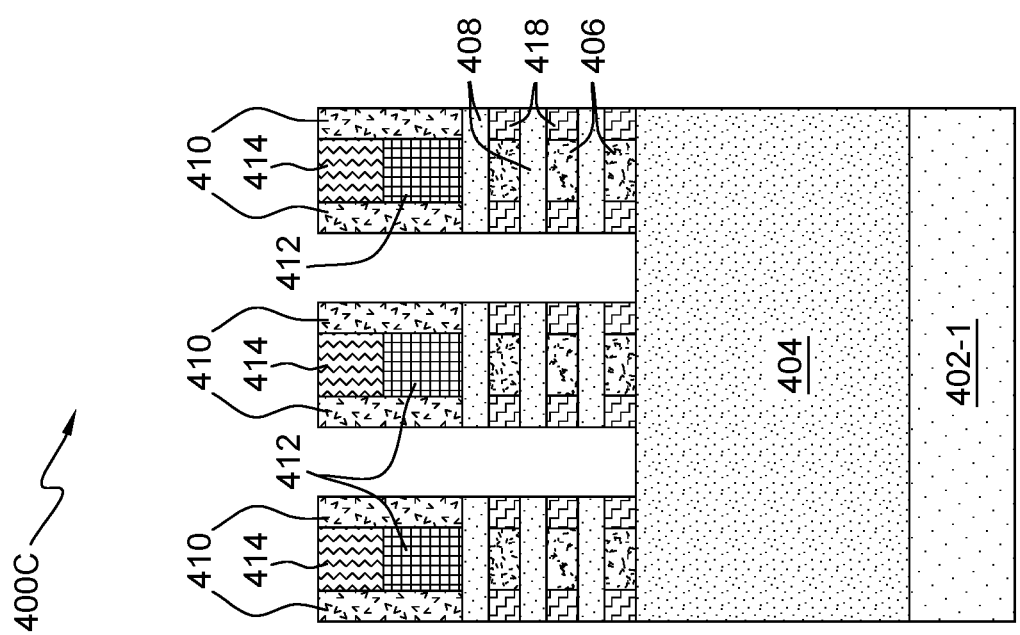
Figure 4C:
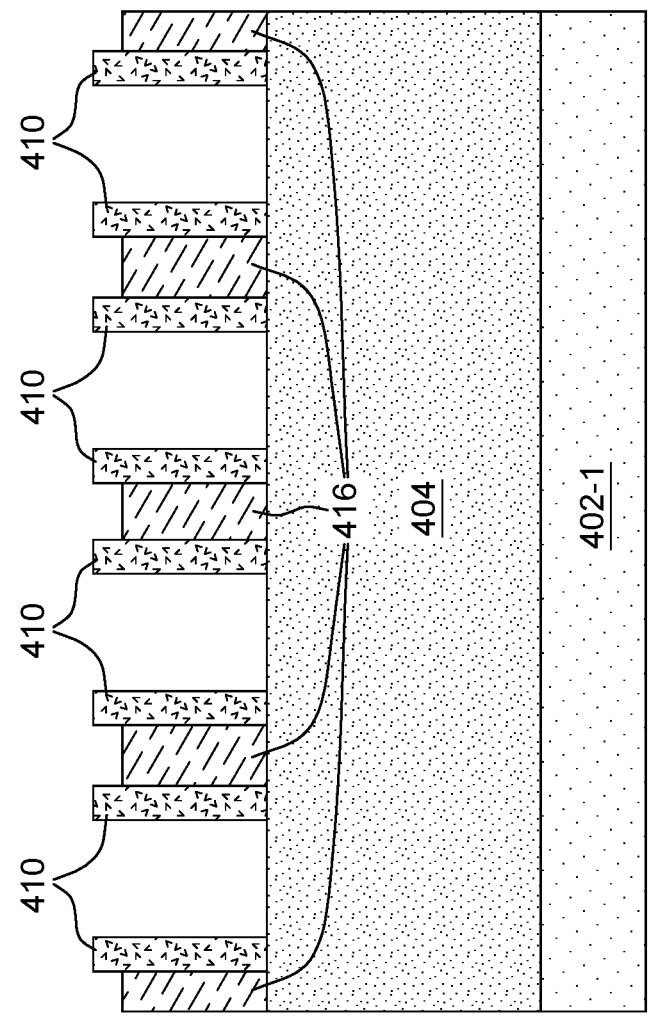

FIG. 4C is an example fabrication state 400C of a semiconductor device being fabricated, according to some embodiments of the present disclosure. In comparison to example fabrication state 400B, the view X of example fabrication state 400C does not include the nanosheet layers (e.g., sacrificial nanosheet layers 406 and channel layers 408) in the areas between the dummy gates 412. Additionally, the view X includes inner spacers 418 that replace portions of the sacrificial nanosheet layers 406 under (as shown) the dummy gates 412. In comparison to example fabrication state 400B, the view Y of example fabrication state 400C does not include any nanosheet stacks.

As stated previously, forming the inner spacers 418 can involve performing a nanosheet recess, SiGe indentation, and inner spacer formation. More specifically, performing nanosheet recess can involve etching back the nanosheet stacks (e.g., sacrificial nanosheet layers 406 and channel layers 408) that are not covered by the gate hardmask 414 and/or spacers 410. Additionally, the SiGe indentation can involve a mechanical process to remove portions of the sacrificial nanosheet layers 406 to provide enough room to deposit material to form the inner spacers 418. Further, inner spacer formation can involve forming the inner spacers 418 by depositing dielectric material in the spaces created by the SiGe indentation. In these ways, the example fabrication state 400C can represent a state of the semiconductor device being fabricated after performing operation 306.

At operation 308, the semiconductor device fabrication manager 150 can direct a fabrication tool to perform BOX recess. For clarity, operation 308 is described with respect to FIG. 4D.

Figure 4D:
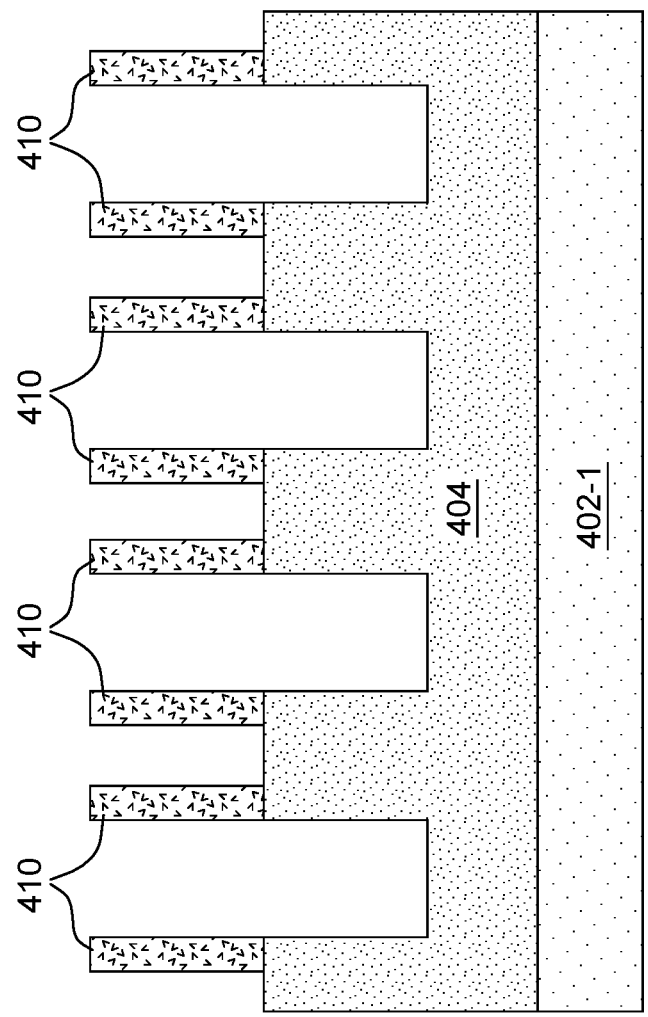
Figure 4D:
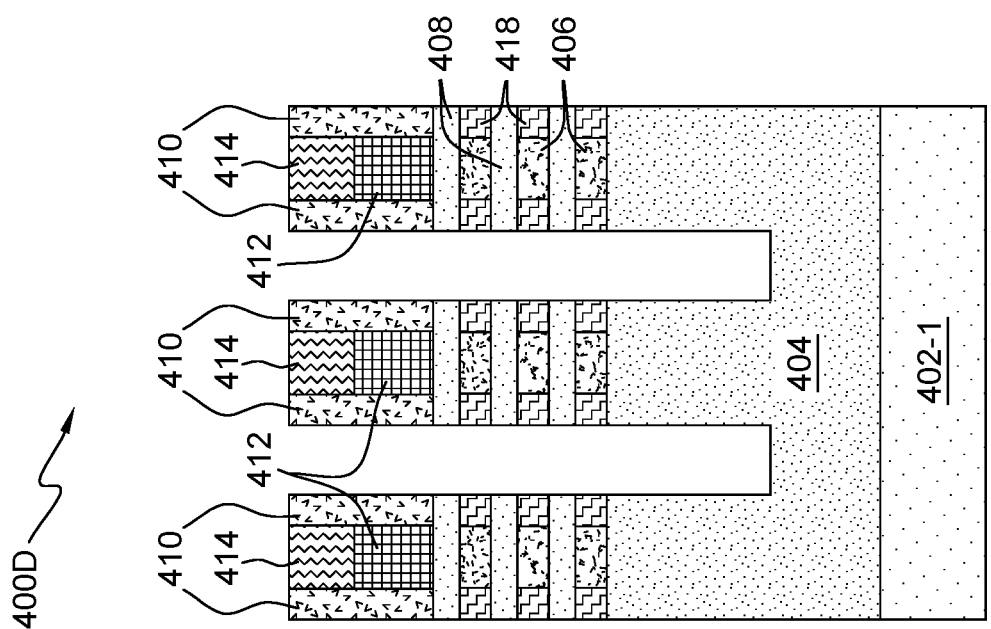

FIG. 4D is an example fabrication state 400D of a semiconductor device being fabricated, according to some embodiments of the present disclosure. In comparison to example fabrication state 400C, the view X of example fabrication state 400D has portions of the BOX layer 404 removed in the location between the dummy gates 412. In comparison to example fabrication state 400C, the view Y of example fabrication state 400D also has portions of the BOX layer 404 removed. Additionally, the view Y has the ILD 416 removed from between the spacers 410. In this way, FIG. 4D can represent a state of the semiconductor device being fabricated after operation 308.

As stated previously, operation 308 can involve performing a BOX recess. Performing the BOX recess involves etching back the ILD 416 between the spacers 410. In this way, performing the BOX recess can involve mechanically removing portions of the BOX layer 404 to create a recess that ultimately becomes an opening for contacts to an S/D epi or forming an unremoved placeholder under an S/D with airgap.

At operation 310, the semiconductor device fabrication manager 150 can direct a fabrication tool to deposit a sacrificial placeholder liner (e.g., sacrificial placeholder liner 420). Depositing the sacrificial placeholder liner 420 can involve depositing a layer of dielectric material over the semiconductor device being fabricated. For clarity, operation 310 is further described with respect to FIG. 4E.

Figure 4E:
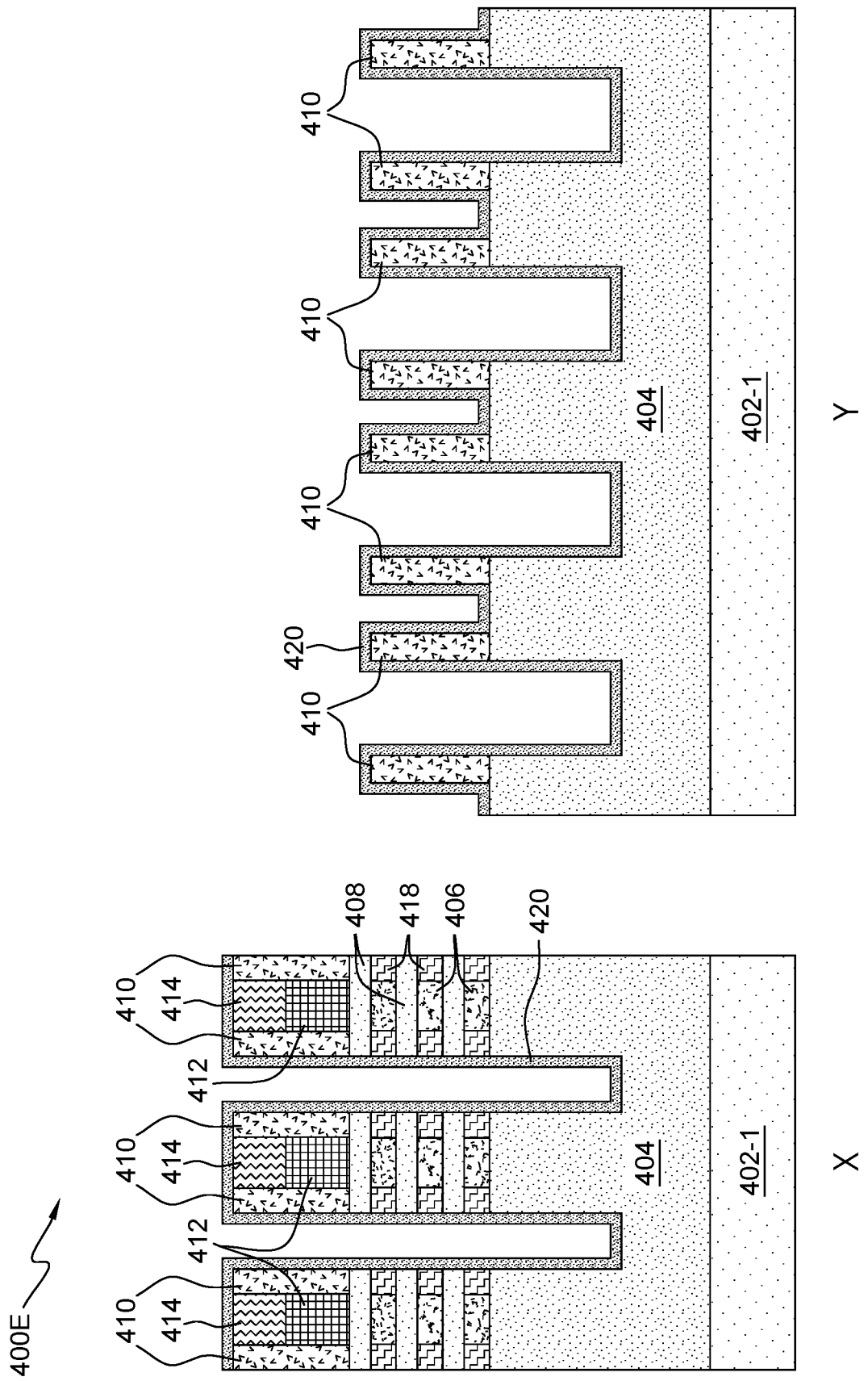

FIG. 4E is a block diagram of an example fabrication state 400E of a semiconductor device, in accordance with some embodiments of the present disclosure. In comparison to example fabrication state 400D, the views X and Y of example fabrication state 400E additionally include conformally deposited material of the sacrificial placeholder liner 420 over the semiconductor device being fabricated. In this way, FIG. 4E can represent a state of the semiconductor device being fabricated after operation 310.

At operation 312, the semiconductor device fabrication manager 150 can direct a fabrication tool to perform sacrificial material overfill and etch back. Performing sacrificial material overfill can involve conformally depositing the material of an organic planarization layer (OPL) 422 over the semiconductor device being fabricated. Further, the etch back can involve removing any deposited material of the OPL 422 from the gate hardmask 414. For clarity, operation 312 is further described with respect to FIG. 4F.

Figure 4F:
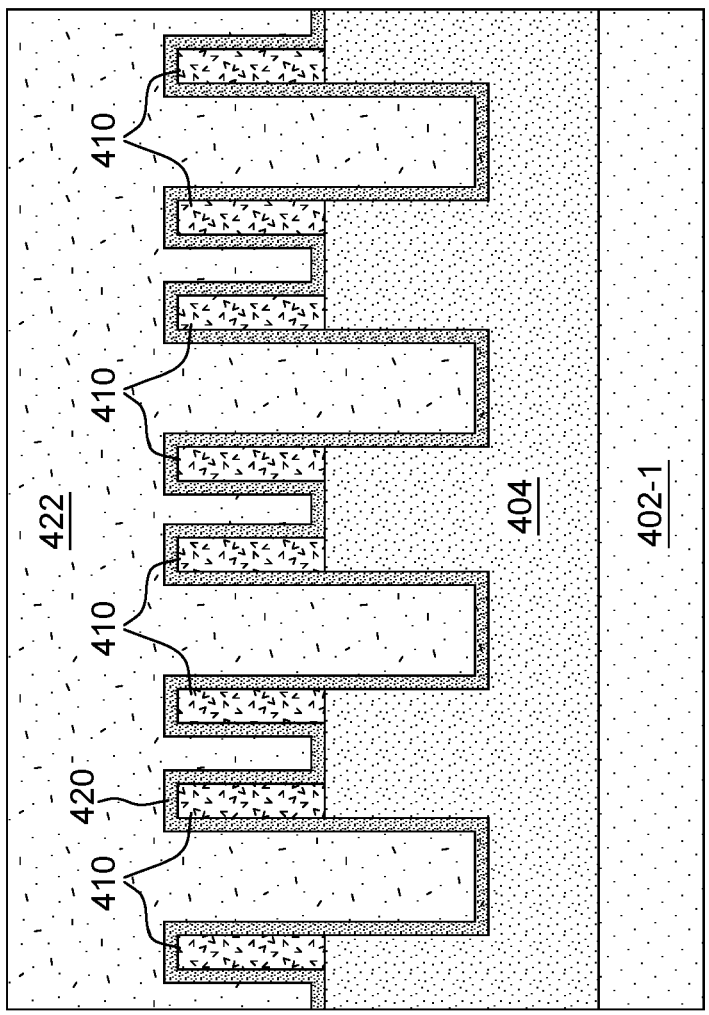
Figure 4F:
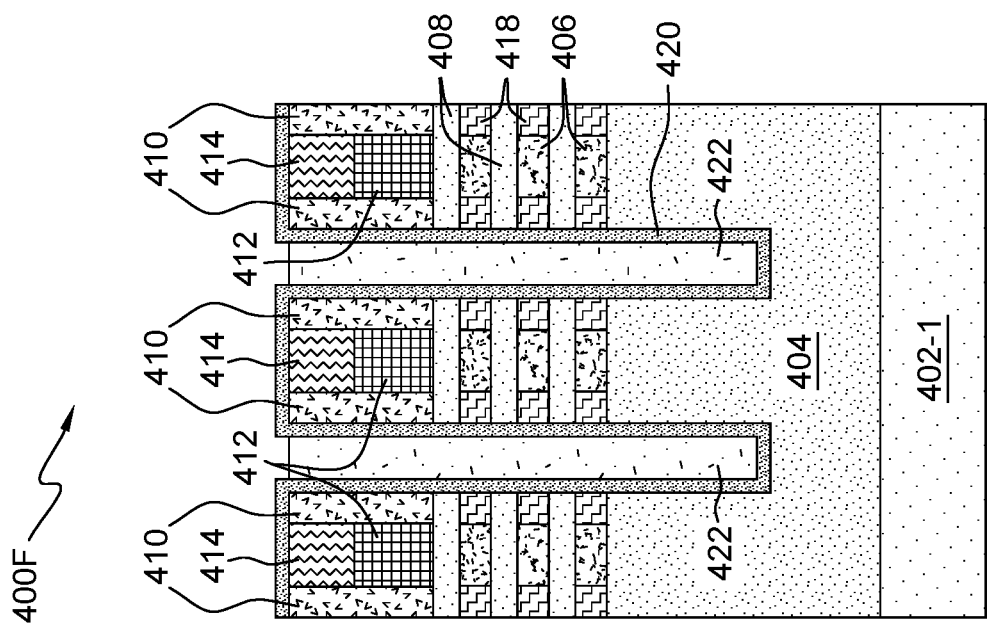

FIG. 4F is a block diagram of an example fabrication state 400F of a semiconductor device, in accordance with some embodiments of the present disclosure. In comparison to example fabrication state 400E, the views X and Y of example fabrication state 400F additionally include the deposited sacrificial material overfill (i.e., OPL 422). In this way, FIG. 4F can represent the semiconductor device being fabricated after operation 312.

At operation 314, the semiconductor device fabrication manager 150 can direct a fabrication tool to perform sacrificial material recess. Performing sacrificial material recess can involve mechanically removing the material of the OPL 422 to expose regions of the sacrificial placeholder liner 420 (e.g., as shown). For clarity, operation 314 is further described with respect to FIG. 4G.

Figure 4G:
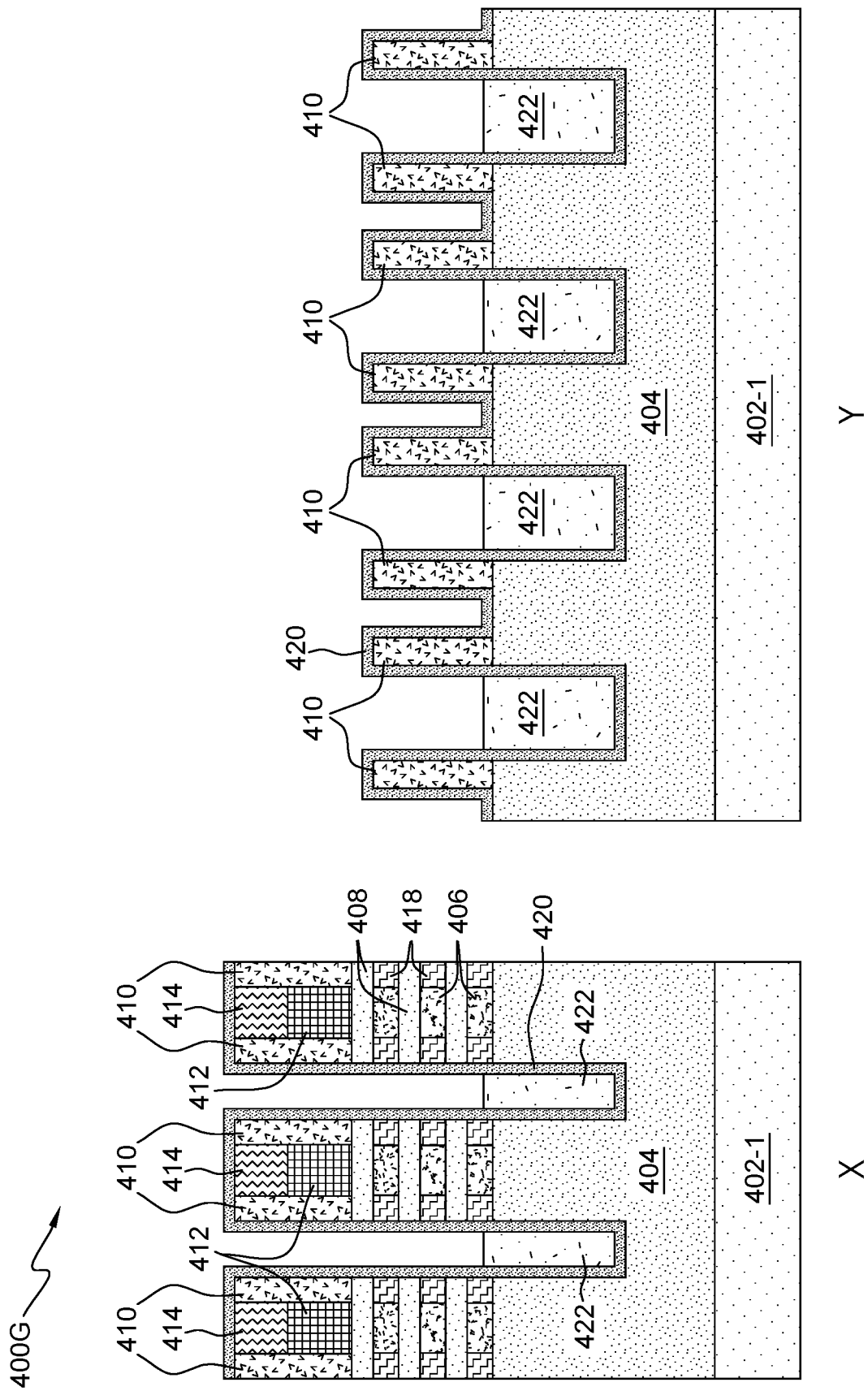

FIG. 4G is a block diagram of an example fabrication state 400G of a semiconductor device, in accordance with some embodiments of the present disclosure. In comparison to example fabrication state 400F, the views X and Y of example fabrication state 400G no longer include material of the OPL 422, between the top (as shown) of the semiconductor device being fabricated and the top of the sacrificial placeholder liner 420 between the inner spacers 410. Removing the OPL 422 in this way can make it possible to protect the sacrificial placeholder liner 420 to the height of the bottom (as shown) of the sacrificial placeholder liner 420. In this way, FIG. 4G can represent the semiconductor device being fabricated after operation 314.

At operation 316, the semiconductor device fabrication manager 150 can direct a fabrication tool to perform exposed placeholder liner removal. Performing exposed placeholder liner removal can involve etching back the material of the sacrificial placeholder liner 420 that is exposed above the remaining OPL 422. For clarity, operation 316 is further described with respect to FIG. 4H.

Figure 4H:
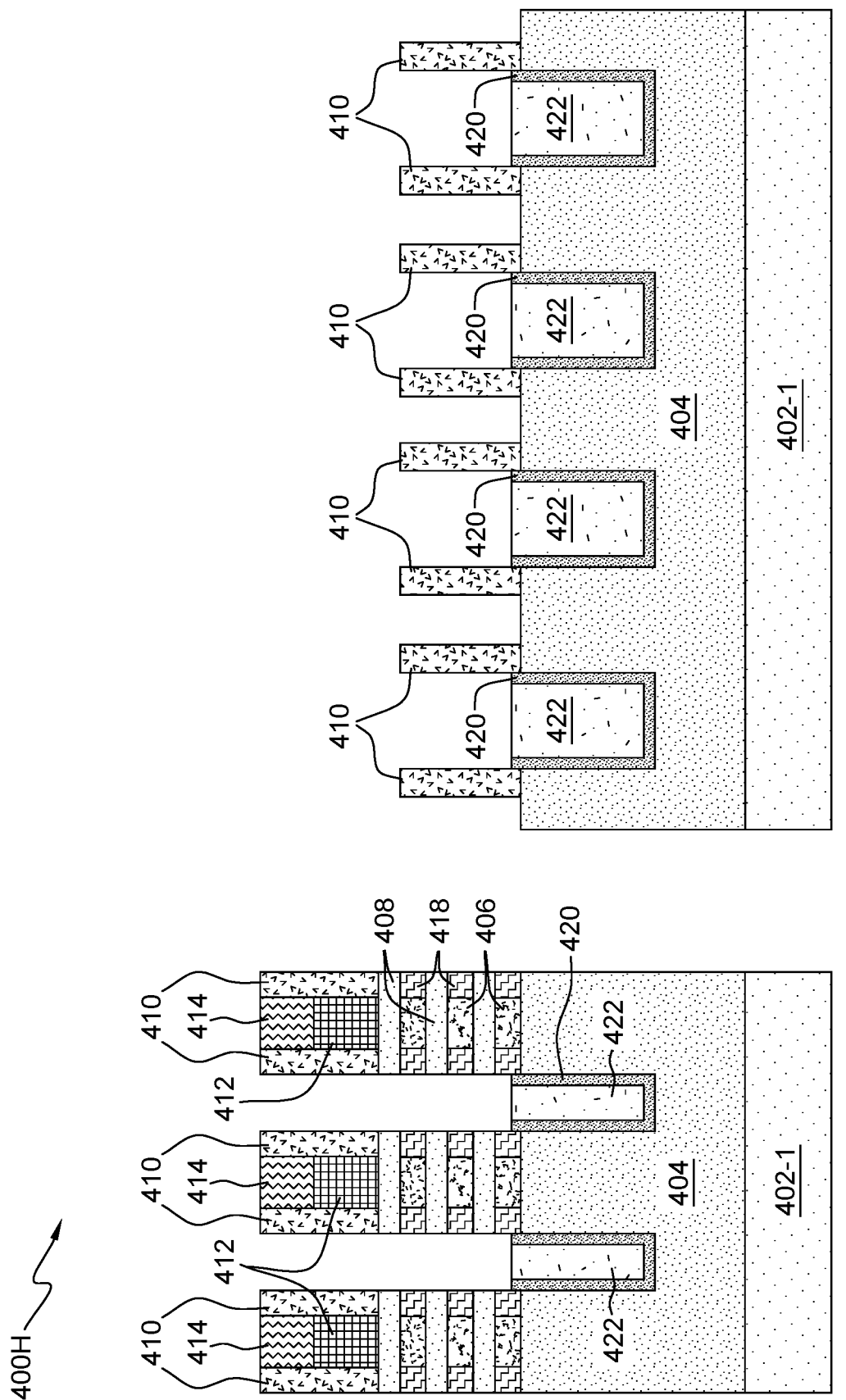

FIG. 4H is a block diagram of an example fabrication state 400H of a semiconductor device, in accordance with some embodiments of the present disclosure. In comparison to example fabrication state 400G, the views X and Y of example fabrication state 400H no longer include sacrificial placeholder liner 420 between the top (as shown) of the semiconductor device and the top of the OPL 422. The OPL 422 protects the underlying sacrificial placeholder liners 420 from the placeholder liner removal. In this way, FIG. 4H can represent the semiconductor device being fabricated after operation 316.

At operation 318, the semiconductor device fabrication manager 150 can direct a fabrication tool to perform sacrificial material removal. Performing sacrificial material removal can involve etching back the remaining OPL 422. For clarity, operation 318 is further described with respect to FIG. 4I.

Figure 4I:
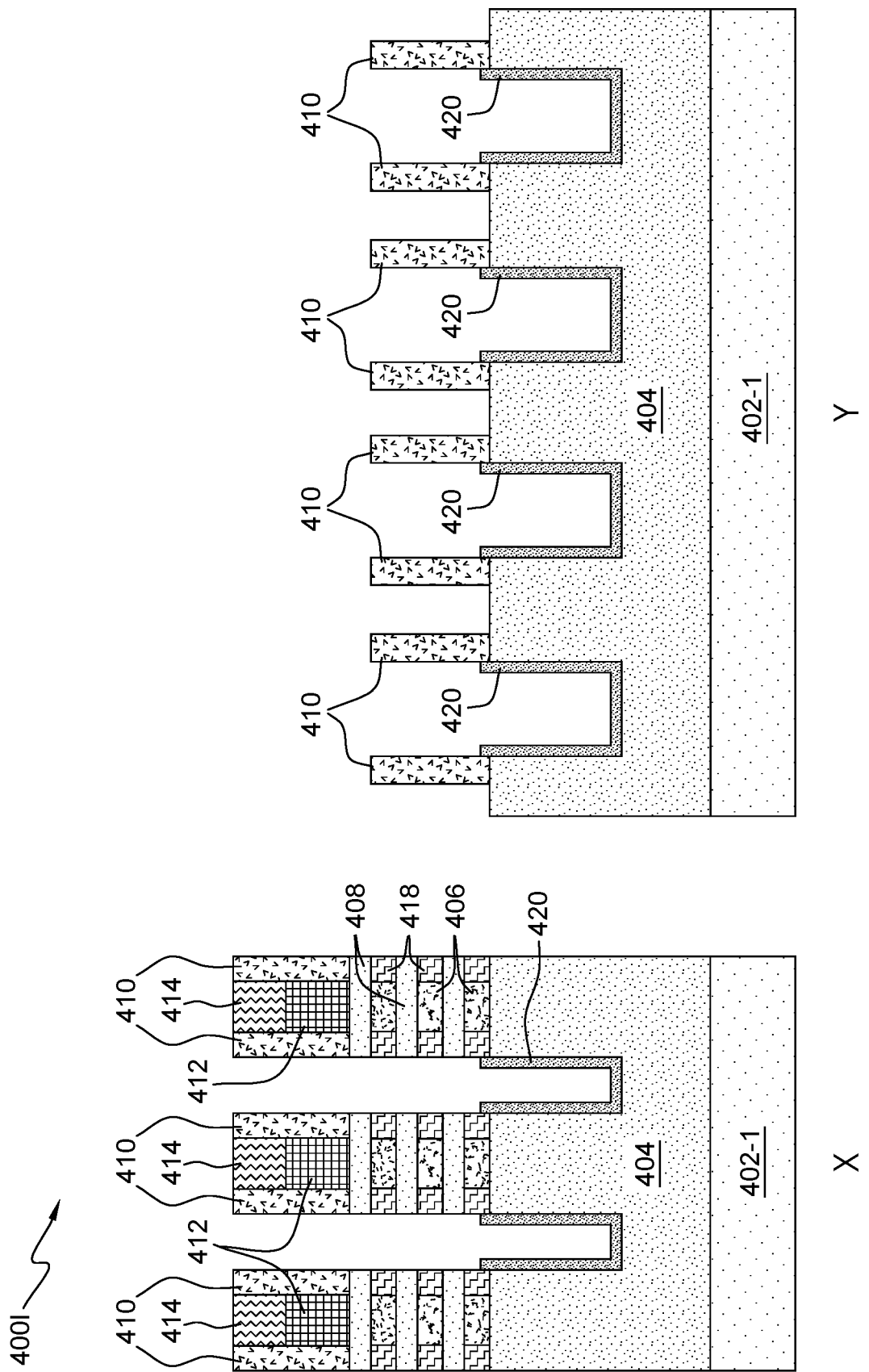

FIG. 4I is a block diagram of an example fabrication state 400I of a semiconductor device, in accordance with some embodiments of the present disclosure. In comparison to example fabrication state 400H, the views X and Y of example fabrication state 400I no longer include the OPL 422. In this way, FIG. 4I can represent the semiconductor device being fabricated after operation 318.

Referring back to FIG. 3A, the operation 318 shows a flow to a placeholder A. The placeholder A does not represent an operation of the method, but serves to connect the operations described in FIG. 3A with the other operations of method 300, which are described in greater detail with respect to FIG. 3B.

FIG. 3B is a process flow chart of operations 320 through 334 of the method 300, in accordance with some embodiments of the present disclosure. For clarity, these operations are described with respect to FIGS. 4J through 4Q.

The process flow chart of FIG. 3B shows a flow from placeholder A to operation 320. As stated previously, the placeholder A does not represent an operation of the method 300, but serves to connect the operations 302-318 described in FIG. 3A with operations 320-334 described below.

At operation 320, the semiconductor device fabrication manager 150 can direct a fabrication tool to perform S/D epi growth. Performing S/D epi growth can involve growing semiconductor S/D epitaxy from exposed semiconductor surface (e.g., the exposed channel layers 408 and inner spacers 418). Because the S/D epi nucleates from the exposed sidewalls of the nanosheets, once the grown S/D epi closes the gap, no other material can fill the space under the S/D epi, thus generating a void. For clarity, operation 320 is further described with respect to FIG. 4J.

Figure 4J:
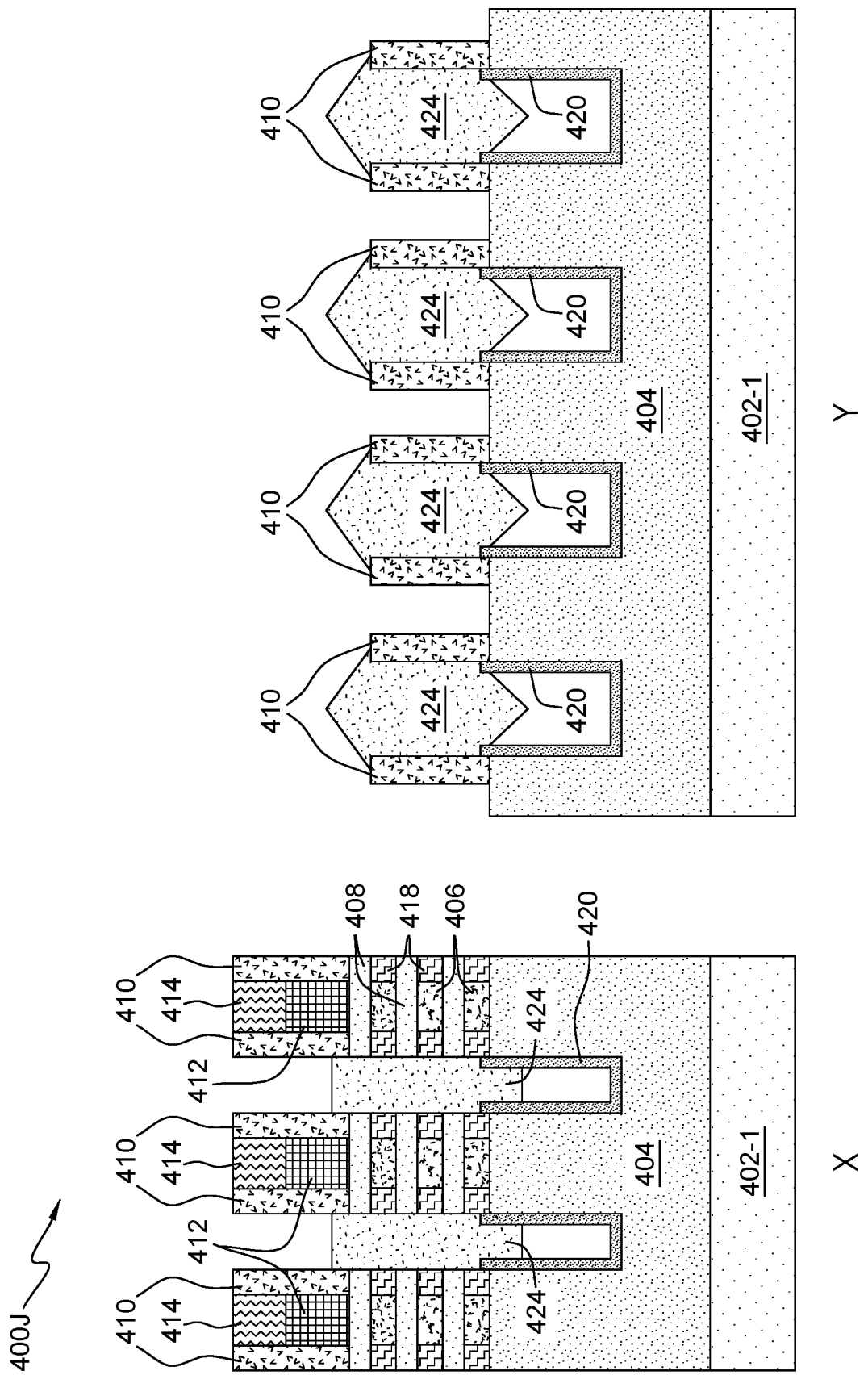

FIG. 4J is a block diagram of an example fabrication state 400J of a semiconductor device, in accordance with some embodiments of the present disclosure. In comparison to example fabrication state 400I, the views X and Y of example fabrication state 400J additionally include the S/D epis 424 (e.g., in their grown state). From this perspective, the sacrificial placeholder liner 420 is positioned under the S/D epi. In these ways, FIG. 4J can represent the semiconductor device being fabricated after operation 320.

At operation 322, the semiconductor device fabrication manager 150 can direct a fabrication tool to perform ILD deposit and chemical-mechanical planarization (CMP), dummy gate and sacrificial nanosheet removal, and to form replacement high-k metal gates (HK/MGs). Performing ILD deposit can involve depositing a dielectric material over (as shown) the semiconductor device being fabricated to form the ILD 416. Further, performing CMP can involve using chemical and mechanical processes to remove gate hardmask 414 and adjacent material of the spacers 410.

Additionally, forming replacement HK/MGs can involve dummy gate removal, SiGe removal, and replacement HK/MG formation. Dummy gate removal can involve an etching process that removes the dummy gate 412 from the semiconductor device being fabricated. Further, the SiGe removal can involve a chemical process that removes the sacrificial nanosheet layers 406 selective to the channel layers 408. Further, replacement HK/MG formation can involve forming the replacement HK/MGs 426 by depositing high-k gate dielectric and metal gate material in the spaces created by removing the dummy gate 412 and sacrificial nanosheet layers 406. For clarity, operation 322 is further described with respect to FIG. 4K.

Figure 4K:
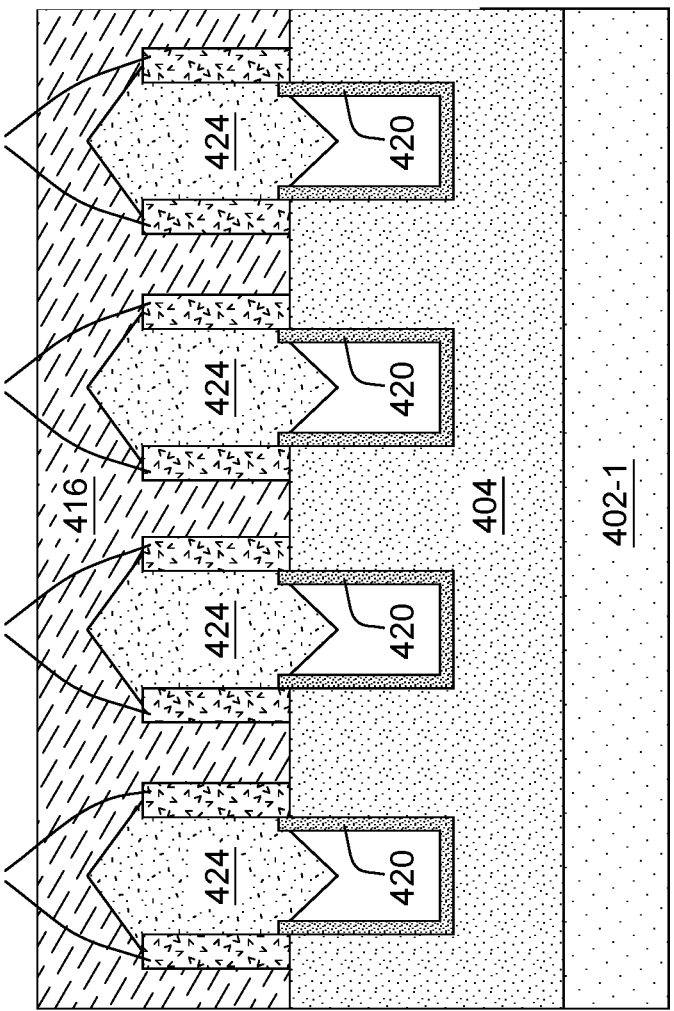
Figure 4K:
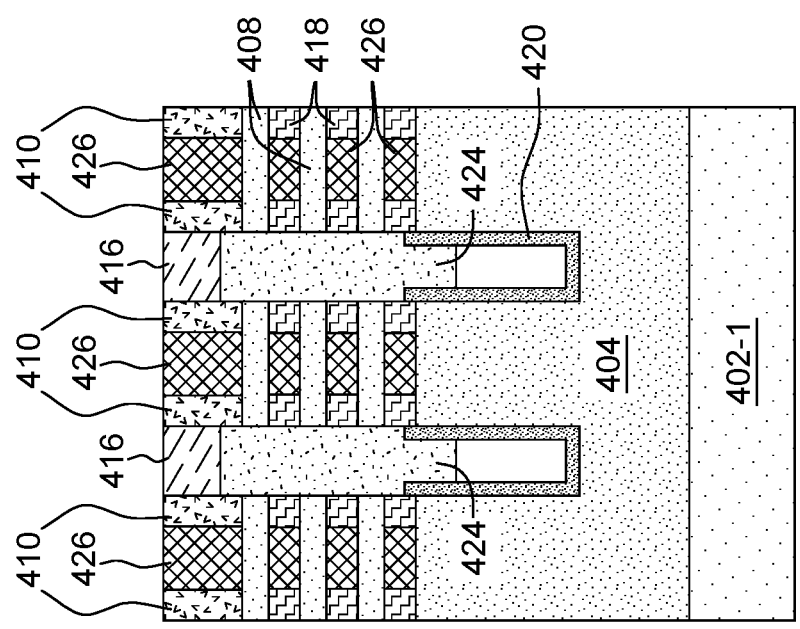

FIG. 4K is a block diagram of an example fabrication state 400K of a semiconductor device, in accordance with some embodiments of the present disclosure. In comparison to example fabrication state 400J, the views X and Y include ILD 416. Further, the view X of example fabrication state 400K no longer includes the dummy gate 412 and sacrificial nanosheet layers 406. Rather, these elements are replaced by the material of the HK/MGs 426. In this way, FIG. 4K can represent the semiconductor device being fabricated after operation 322.

At operation 324, the semiconductor device fabrication manager 150 can direct a fabrication tool to perform middle of line (MOL)/BEOL interconnect formation and carrier wafer bonding. Performing MOL interconnect formation can involve depositing additional ILD, removing material from a frontside of the ILD 416 to provide access to the S/D epis 424. Additionally, MOL interconnect formation can involve depositing the metal material of the contacts 430-A, 430-B in the frontside openings created by removing the ILD 416 material. In this way, some embodiments of the present disclosure can provide frontside contacts wiring an S/D epi 424 to the BEOL 428-1. Additionally, performing BEOL interconnect formation can involve fabricating the elements of the BEOL 428-1, such as, multiple layers of Cu based metal lines and vias. Further, carrier wafer bonding can involve bonding the carrier wafer 402-2 to the BEOL 428-1. For clarity, operation 324 is further described with respect to FIG. 4L.

Figure 4L:
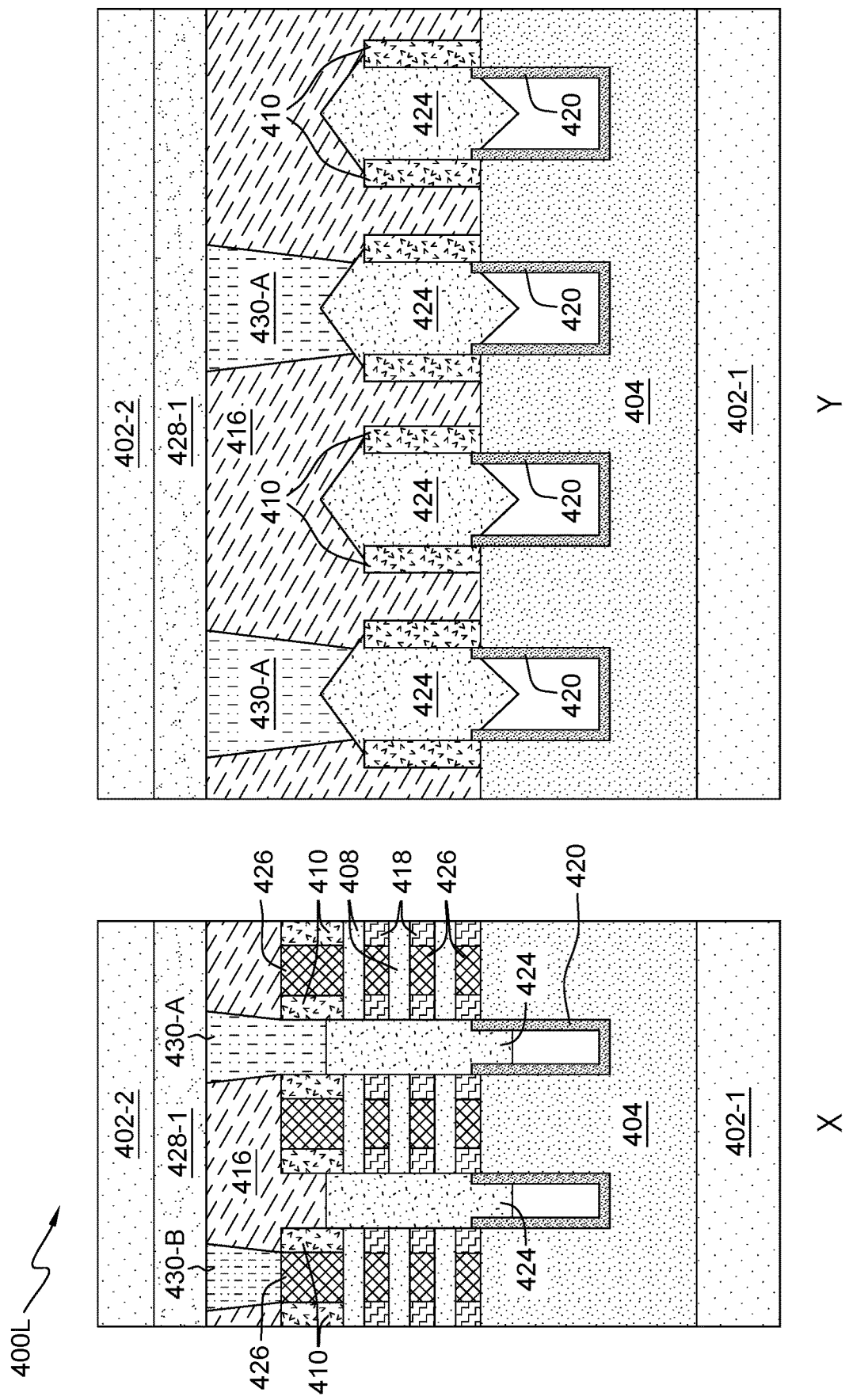

FIG. 4L is a block diagram of an example fabrication state 400L of a semiconductor device, in accordance with some embodiments of the present disclosure. In comparison to example fabrication state 400K, the views X and Y of example fabrication state 400L additionally include the BEOL 428-1, contacts 430-A, 430-B, and carrier wafer 402-2. In this way, FIG. 4L can represent the semiconductor device being fabricated after operation 324.

At operation 326, the semiconductor device fabrication manager 150 can direct a fabrication tool to perform a wafer flip and substrate removal. Performing the wafer flip can involve reversing the vertical orientation of the semiconductor device being fabricated. Additionally, the substrate removal can involve removing the substrate 402-1, exposing the BOX layer 404. For clarity, operation 326 is further described with respect to FIG. 4M.

Figure 4M:
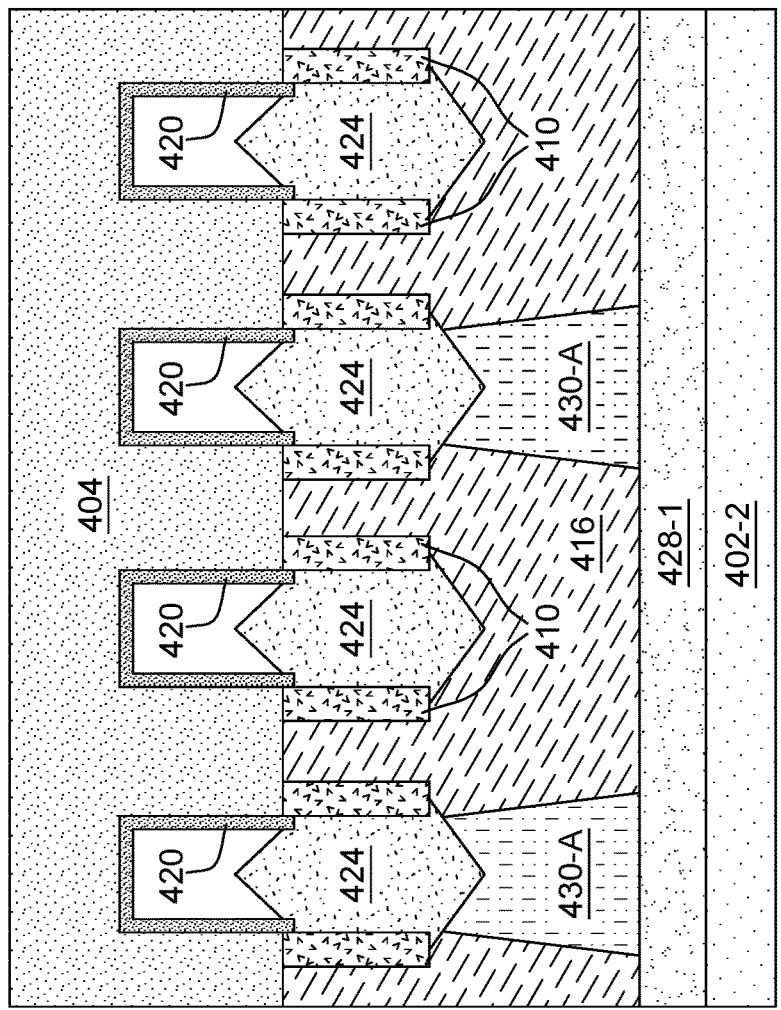
Figure 4M:
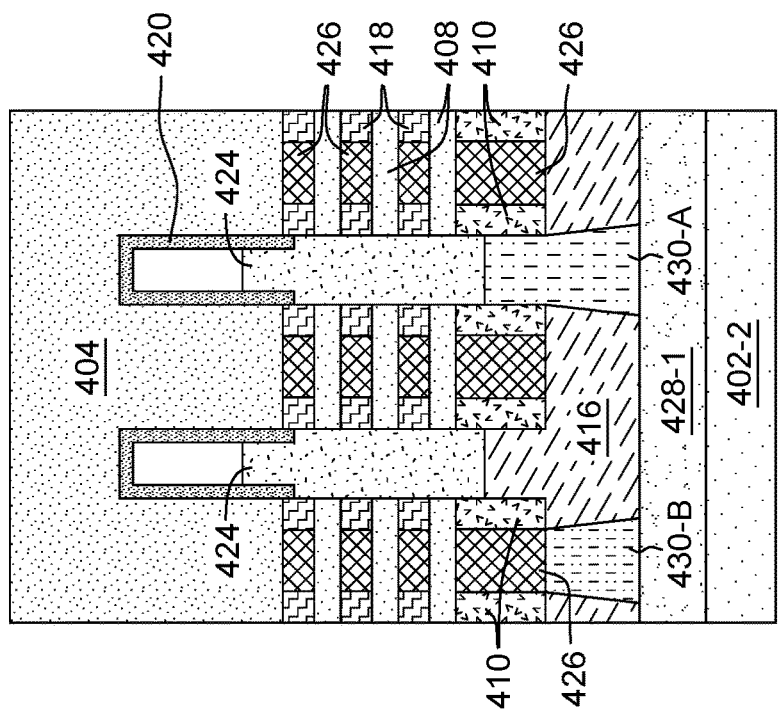

FIG. 4M is a block diagram of an example fabrication state 400M of a semiconductor device, in accordance with some embodiments of the present disclosure. In comparison to example fabrication state 400L, the views X and Y represent the reversed vertical orientation of the semiconductor device being fabricated. Additionally, example fabrication state 400M no longer include the substrate 402-1 in contact with the BOX layer 404. In this way, FIG. 4M can represent the semiconductor device being fabricated after operation 326.

At operation 328, the semiconductor device fabrication manager 150 can direct a fabrication tool to perform backside contact patterning. Performing backside contact patterning can involve creating openings for the metal contacts that wire the S/D epis 424 to the backside interconnect. Creating these openings can involve removing material from the BOX layer 404, and portions of the sacrificial placeholder liner 420 to expose the S/D epis 424. For clarity, operation 328 is further described with respect to FIG. 4N.

Figure 4N:
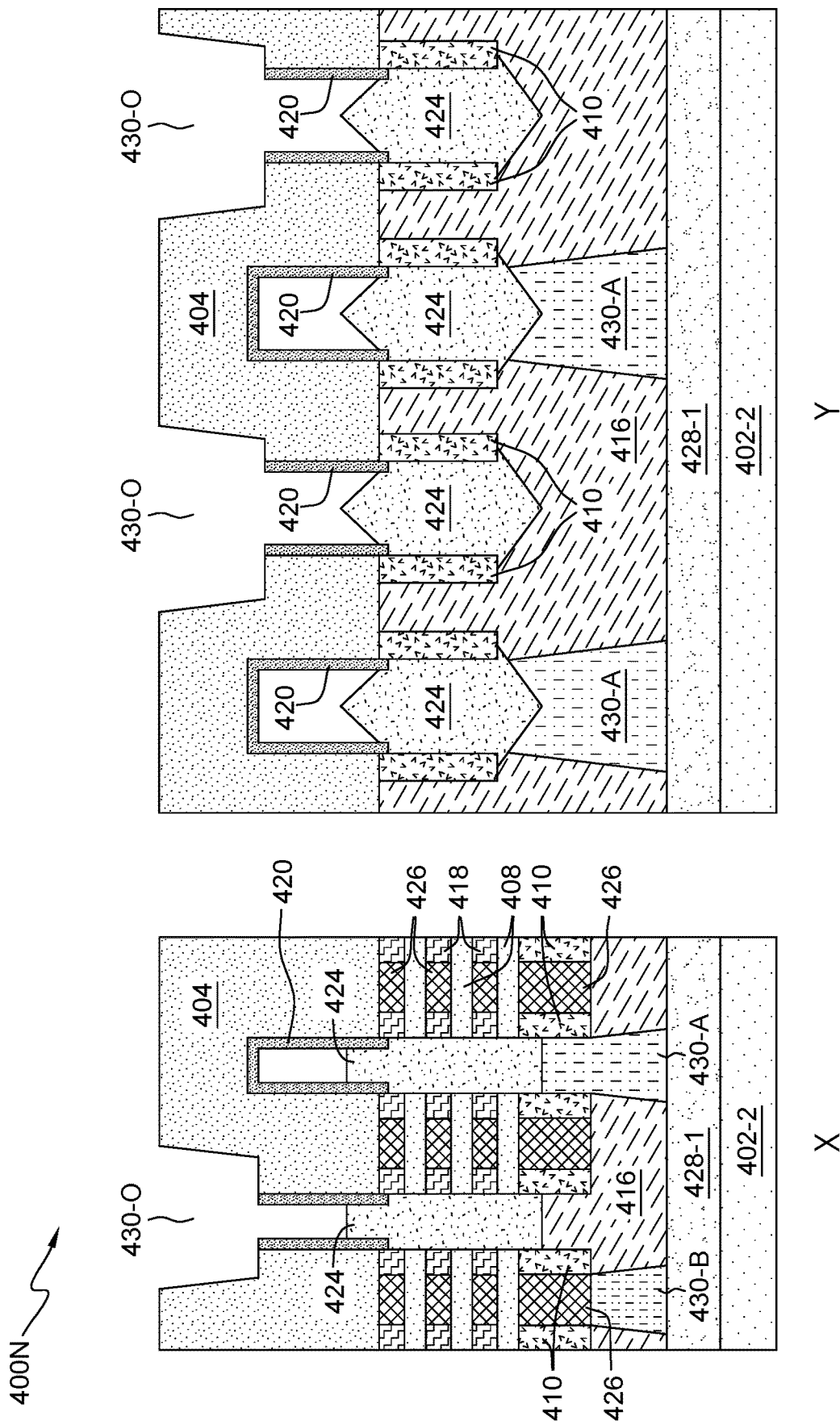

FIG. 4N is a block diagram of an example fabrication state 400N of a semiconductor device, in accordance with some embodiments of the present disclosure. In comparison to example fabrication state 400M, the views X and Y include contact openings 430-O in place of the removed BOX layer 404 material and sacrificial placeholder liner 420 portions. In this way, FIG. 4N can represent the semiconductor device being fabricated after operation 328.

At operation 330, the semiconductor device fabrication manager 150 can direct a fabrication tool to perform exposed placeholder liner removal. Exposed placeholder liner removal can include a selective etch process that etches the remaining portions of the sacrificial placeholder liner 420 exposed by the contact openings 430-O. For clarity, operation 330 is further described with respect to FIG. 4O.

Figure 4O:
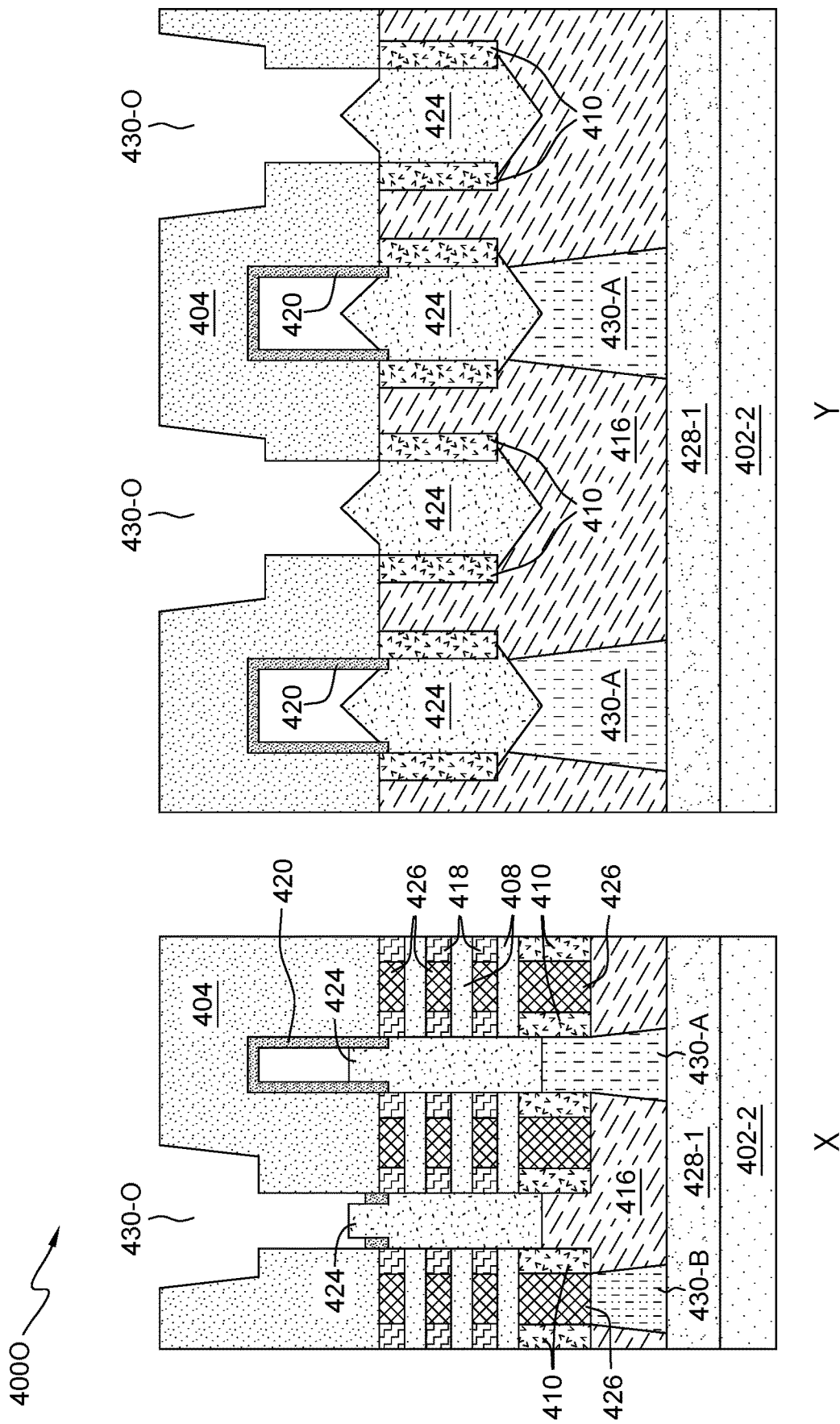

FIG. 4O is a block diagram of an example fabrication state 400O of a semiconductor device, in accordance with some embodiments of the present disclosure. In comparison to example fabrication state 400N, the views X and Y no longer include the sacrificial placeholder liner 420 portions that are exposed by the contact openings 430-O. In contrast the remaining sacrificial placeholder liners are not exposed due to the remaining material of the surrounding BOX layer 404. In this way, FIG. 4O can represent the semiconductor device being fabricated after operation 330.

At operation 332, the semiconductor device fabrication manager 150 can direct a fabrication tool to perform backside contact metallization. Backside contact metallization can include depositing the metal material of the backside contacts 430-BA in the contact openings 430-O. In this way, some embodiments of the present disclosure can provide backside contacts wiring the S/D epis 424 to a backside interconnect, described in greater detail below. For clarity, operation 332 is further described with respect to FIG. 4P.

Figure 4P:
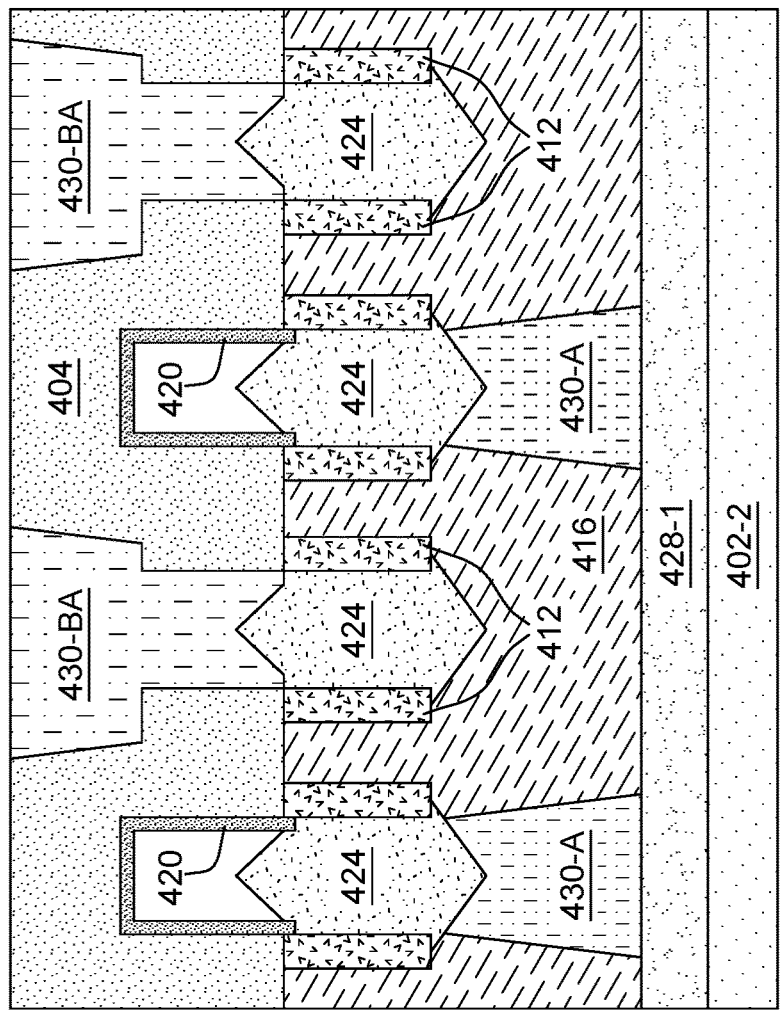
Figure 4P:
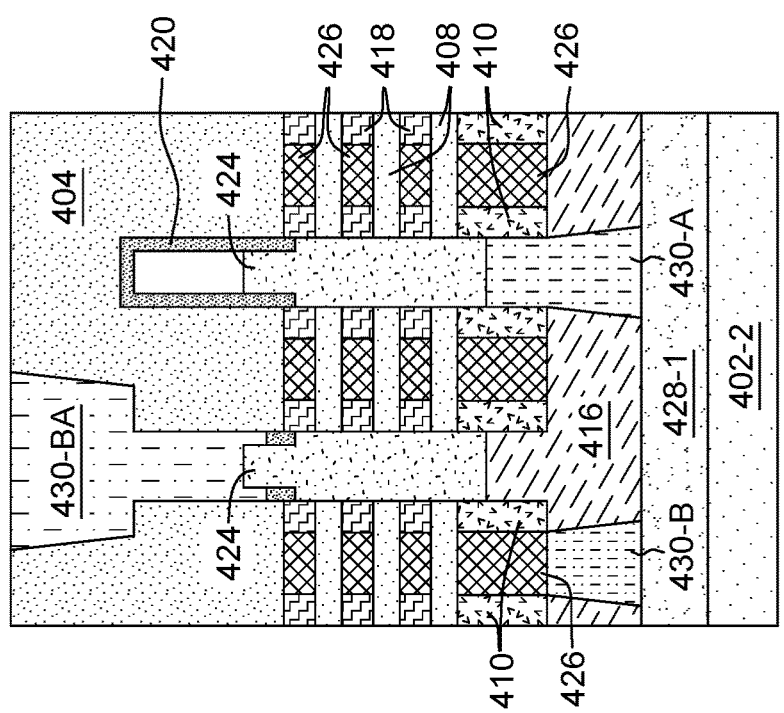
Figure 4Q:
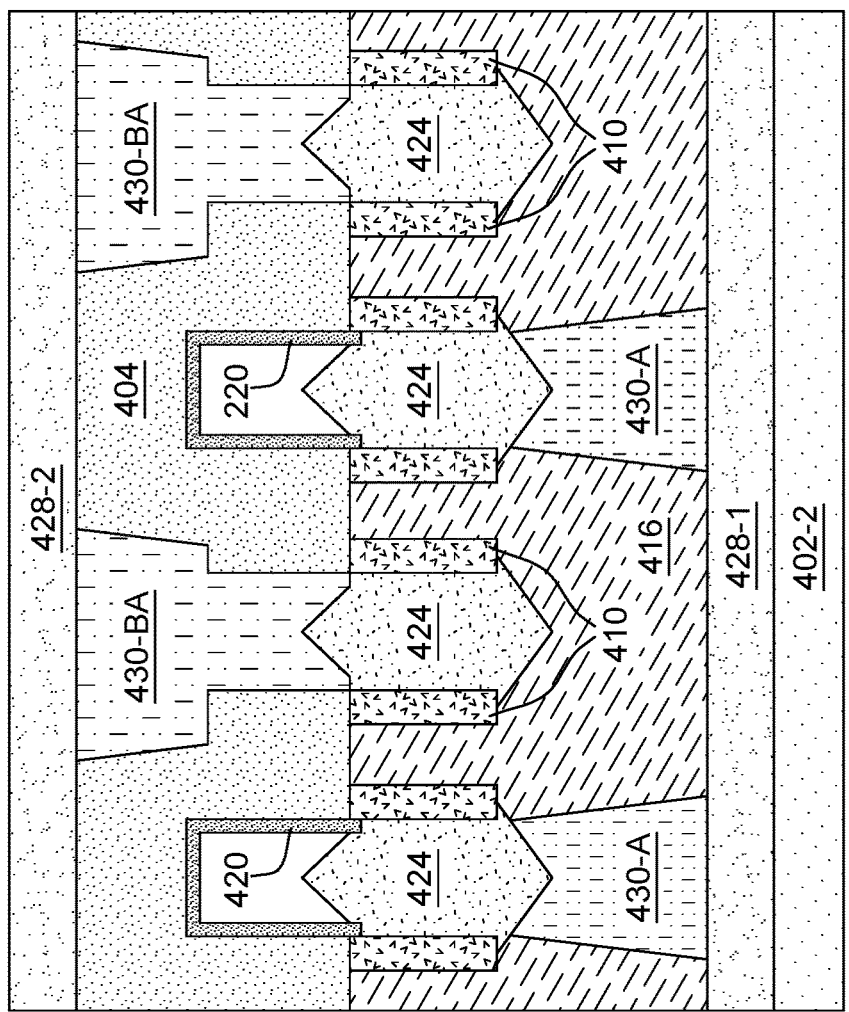
Figure 4Q:
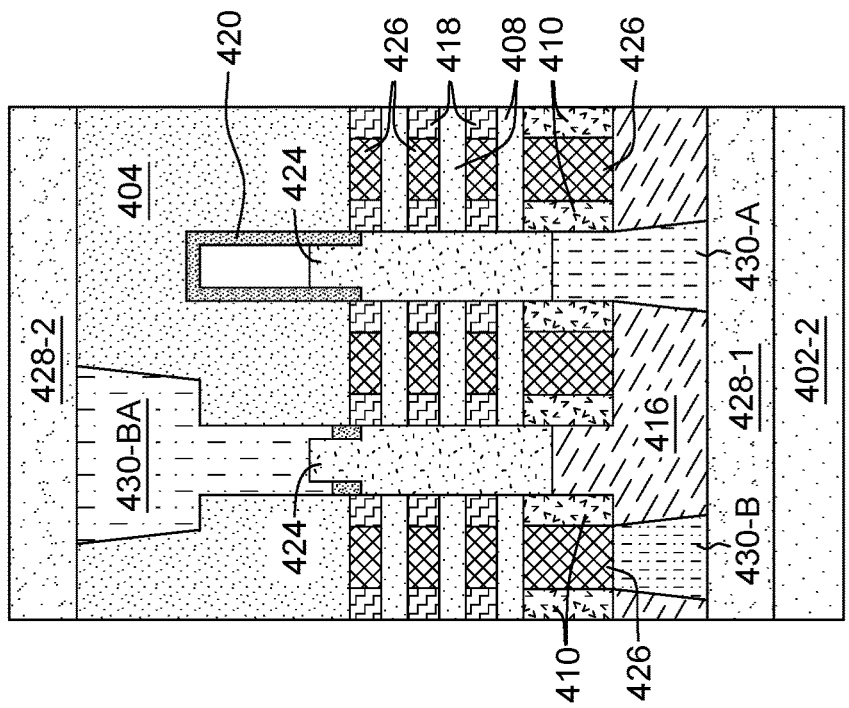

FIG. 4P is a block diagram of an example fabrication state 400P of a semiconductor device, in accordance with some embodiments of the present disclosure. In comparison to example fabrication state 400O, the views X and Y include backside contacts 430-BA in the space occupied by the contact openings 430-O in example fabrication state 400O. In this way, FIG. 4P can represent the semiconductor device being fabricated after operation 332.

At operation 334, the semiconductor device fabrication manager 150 can direct a fabrication tool to perform backside interconnect formation. Backside interconnect formation can involve fabricating the elements of the backside interconnect 428-2, such as, metallic lines, ILD material, and a heavy metal layer. For clarity, operation 334 is further described with respect to FIG. 4Q.

FIG. 4Q is a block diagram of an example fabrication state 400Q of a semiconductor device, in accordance with some embodiments of the present disclosure. In comparison to example fabrication state 400P, the views X and Y include the backside interconnect 428-2. In this way, FIG. 4Q can represent the semiconductor device being fabricated after operation 334.

What is claimed is:

1. A semiconductor device comprising:
a field effect transistor (FET);
a frontside contact that wires a first source/drain (S/D) epitaxial (epi) of the FET to a back end of line (BEOL) interconnect;
a placeholder recess disposed under the first S/D epi;
a sacrificial placeholder that lines the placeholder recess; and
a void between the sacrificial placeholder and the first S/D epi,
wherein the void is configured to provide an open space within which the first S/D epi can grow and increase a surface area of the first S/D epi.

2. The semiconductor device of claim 1, further comprising a backside contact that wires a second S/D epi of the FET and a backside interconnect.

3. The semiconductor device of claim 2, wherein the FET is disposed horizontally between the first S/D epi and the second S/D epi.

4. The semiconductor device of claim 3, wherein a BEOL is in contact with the frontside contact.

5. The semiconductor device of claim 2, wherein the backside interconnect is in contact with the backside contact.

6. The semiconductor device of claim 5, further comprising a carrier wafer.

* * * * *